(12) United States Patent
Nesler et al.

(10) Patent No.: US 10,901,446 B2
(45) Date of Patent: *Jan. 26, 2021

(54) SMART BUILDING MANAGER

(71) Applicant: Johnson Controls Technology Company, Holland, MI (US)

(72) Inventors: Clay G. Nesler, Brookfield, WI (US); Kirk H. Drees, Cedarburg, WI (US); James P. Kummer, Wales, WI (US); Derek Supple, Milwaukee, WI (US); Marc D. Andraca, Whitefish Bay, WI (US); John I. Ruiz, New Berlin, WI (US); Paul Harrison Rode, Tarrytown, NY (US)

(73) Assignee: Johnson Controls Technology Company, Auburn Hills, MI (US)

( * ) Notice: Subject to any disclaimer, the term of this patent is extended or adjusted under 35 U.S.C. 154(b) by 359 days.

This patent is subject to a terminal disclaimer.

(21) Appl. No.: 15/224,205

(22) Filed: Jul. 29, 2016

(65) Prior Publication Data

US 2016/0334825 A1 Nov. 17, 2016

Related U.S. Application Data

(63) Continuation of application No. 14/091,261, filed on Nov. 26, 2013, now Pat. No. 9,429,927, which is a
(Continued)

(51) Int. Cl.
*G05D 3/12* (2006.01)
*G05D 5/00* (2006.01)
(Continued)

(52) U.S. Cl.
CPC ............ *G05F 1/66* (2013.01); *G01R 21/133* (2013.01); *G05B 11/01* (2013.01); *G05B 15/02* (2013.01);
(Continued)

(58) Field of Classification Search
CPC .. G05F 1/66; G06Q 30/0202; G06Q 30/0206; G06Q 10/0637; G06Q 50/06;
(Continued)

(56) References Cited

U.S. PATENT DOCUMENTS 2,812,141 A 11/1957 Sueda et al.
3,181,791 A 5/1965 Axelrod
(Continued)

FOREIGN PATENT DOCUMENTS

JP 63-231127 A 9/1988
JP 04-062352 A 2/1992
(Continued)

OTHER PUBLICATIONS

Office Action on U.S. Appl. No. 14/921,889 dated Apr. 16, 2018. 48 pages.
(Continued)

*Primary Examiner* — Zhipeng Wang
(74) *Attorney, Agent, or Firm* — Foley & Lardner LLP

(57) ABSTRACT

A building manager includes a communications interface configured to receive information from a smart energy grid. The building manager further includes an integrated control layer configured to receive inputs from and to provide outputs to a plurality of building subsystems. The integrated control layer includes a plurality of control algorithm modules configured to process the inputs and to determine the outputs. The building manager further includes a fault detection and diagnostics layer configured to use statistical analysis on the inputs received from the integrated control layer to detect and diagnose faults. The building manager yet further includes a demand response layer configured to process the information received from the smart energy grid to determine adjustments to the plurality of control algorithms of the integrated control layer.

20 Claims, 9 Drawing Sheets

Related U.S. Application Data continuation of application No. 12/819,977, filed on Jun. 21, 2010, now Pat. No. 8,600,556.

(60) Provisional application No. 61/219,326, filed on Jun. 22, 2009, provisional application No. 61/234,217, filed on Aug. 14, 2009, provisional application No. 61/302,854, filed on Feb. 9, 2010.

(51) Int. Cl.

| | | |
|---|---|---|
| *G05D 9/00* | (2006.01) | |
| *G05D 11/00* | (2006.01) | |
| *G05D 17/00* | (2006.01) | |
| *G05F 1/66* | (2006.01) | |
| *G06Q 10/06* | (2012.01) | |
| *G06Q 50/06* | (2012.01) | |
| *G06Q 50/16* | (2012.01) | |
| *H02J 13/00* | (2006.01) | |
| *G01R 21/133* | (2006.01) | |
| *G05B 15/02* | (2006.01) | |
| *G05B 17/02* | (2006.01) | |
| *G05B 11/01* | (2006.01) | |
| *G06Q 30/02* | (2012.01) | |

(52) U.S. Cl.
CPC ......... *G05B 17/02* (2013.01); *G06Q 10/0637* (2013.01); *G06Q 30/0202* (2013.01); *G06Q 30/0206* (2013.01); *G06Q 50/06* (2013.01); *G06Q 50/163* (2013.01); *H02J 13/00001* (2020.01); *H02J 13/0062* (2013.01); *G05B 2219/2642* (2013.01); *G05B 2219/49068* (2013.01); *H02J 13/0013* (2013.01); *H02J 2203/20* (2020.01); *Y02A 30/60* (2018.01); *Y02B 70/30* (2013.01); *Y02B 90/20* (2013.01); *Y02E 60/00* (2013.01); *Y02P 90/84* (2015.11); *Y02P 90/845* (2015.11); *Y04S 20/20* (2013.01); *Y04S 20/221* (2013.01); *Y04S 40/12* (2013.01); *Y04S 40/124* (2013.01); *Y04S 40/20* (2013.01); *Y04S 50/14* (2013.01)

(58) Field of Classification Search
CPC .... G06Q 50/163; G01R 21/133; Y02A 30/62; Y02P 90/84; Y02P 90/845; Y04S 50/14; Y04S 20/227; Y04S 20/221; Y04S 40/12; Y04S 40/124; Y04S 40/22; Y04S 10/54; G05B 11/01; G05B 17/02; G05B 15/02; G05B 2219/49068; G05B 2219/2642; H02J 13/0062; H02J 13/001; H02J 2003/007; H02J 13/0013; Y02B 90/2638; Y02B 70/3241; Y02B 70/3216; Y02B 90/2607; Y02E 60/76
USPC ........................................................ 700/295
See application file for complete search history.

(56) References Cited

U.S. PATENT DOCUMENTS

| | | |
|---|---|---|
| 3,641,326 A | 2/1972 | Harte |
| 3,998,093 A | 12/1976 | Bertolasi |
| 4,114,807 A | 9/1978 | Naseck et al. |
| 4,182,180 A | 1/1980 | Mott |
| 4,199,101 A | 4/1980 | Bramow et al. |
| 4,211,089 A | 7/1980 | Mueller et al. |
| 4,213,174 A | 7/1980 | Morley et al. |
| 4,257,238 A | 3/1981 | Kountz et al. |
| 4,319,461 A | 3/1982 | Shaw |
| 4,325,223 A | 4/1982 | Cantley |
| 4,346,446 A | 8/1982 | Erbstein et al. |
| 4,432,031 A | 2/1984 | Premerlani |
| 4,512,161 A | 4/1985 | Logan et al. |
| 4,557,317 A | 12/1985 | Harmon, Jr. |
| 4,558,595 A | 12/1985 | Kompelien |
| 4,607,789 A | 8/1986 | Bowman |
| 4,611,470 A | 9/1986 | Enstrom |
| 4,622,922 A | 11/1986 | Miyagaki et al. |
| 4,749,122 A | 6/1988 | Shriver et al. |
| 4,776,301 A | 10/1988 | Dziubakowski |
| 4,802,100 A | 1/1989 | Aasen et al. |
| 4,855,922 A | 8/1989 | Huddleston et al. |
| 4,866,635 A | 9/1989 | Kahn et al. |
| 4,876,858 A | 10/1989 | Shaw et al. |
| 4,897,798 A | 1/1990 | Cler |
| 4,916,909 A | 4/1990 | Mathur et al. |
| 4,942,740 A | 7/1990 | Shaw et al. |
| 4,964,126 A | 10/1990 | Musicus et al. |
| 5,042,997 A | 8/1991 | Rhodes |
| 5,074,137 A | 12/1991 | Harris et al. |
| 5,090,303 A | 2/1992 | Ahmed |
| 5,099,436 A | 3/1992 | McCown et al. |
| 5,103,391 A | 4/1992 | Barrett |
| 5,115,967 A | 5/1992 | Wedekind |
| 5,131,746 A | 7/1992 | O'Rourke et al. |
| 5,189,606 A | 2/1993 | Burns et al. |
| 5,218,525 A | 6/1993 | Amasaki et al. |
| 5,251,814 A | 10/1993 | Warashina et al. |
| 5,253,159 A | 10/1993 | Bilas et al. |
| 5,274,571 A | 12/1993 | Hesse et al. |
| 5,299,312 A | 3/1994 | Rocco, Jr. |
| 5,315,502 A | 5/1994 | Koyama et al. |
| 5,346,129 A | 9/1994 | Shah et al. |
| 5,351,855 A | 10/1994 | Nelson et al. |
| 5,355,305 A | 10/1994 | Seem et al. |
| 5,384,697 A | 1/1995 | Pascucci |
| 5,414,640 A | 5/1995 | Seem |
| 5,426,421 A | 6/1995 | Gray |
| 5,461,877 A | 10/1995 | Shaw et al. |
| 5,467,287 A | 11/1995 | Wenner et al. |
| 5,481,481 A | 1/1996 | Frey et al. |
| 5,506,768 A | 4/1996 | Seem et al. |
| 5,528,516 A | 6/1996 | Yemini et al. |
| 5,552,763 A | 9/1996 | Kirby |
| 5,555,195 A | 9/1996 | Jensen et al. |
| 5,557,546 A | 9/1996 | Fukai et al. |
| 5,566,084 A | 10/1996 | Cmar |
| 5,566,092 A | 10/1996 | Wang et al. |
| 5,568,377 A | 10/1996 | Seem et al. |
| 5,572,878 A | 11/1996 | Kapoor |
| 5,582,021 A | 12/1996 | Masauji |
| 5,590,830 A | 1/1997 | Kettler et al. |
| 5,592,147 A | 1/1997 | Wong |
| 5,596,507 A | 1/1997 | Jones et al. |
| 5,602,761 A | 2/1997 | Spoerre et al. |
| 5,663,963 A | 9/1997 | Goodwin, III |
| 5,675,979 A | 10/1997 | Shah |
| 5,682,329 A | 10/1997 | Seem et al. |
| 5,751,916 A | 5/1998 | Kon et al. |
| 5,769,315 A | 6/1998 | Drees |
| 5,791,408 A | 8/1998 | Seem |
| 5,801,940 A | 9/1998 | Russ et al. |
| 5,838,561 A | 11/1998 | Owen |
| 5,867,384 A | 2/1999 | Drees et al. |
| 5,884,072 A | 3/1999 | Rasmussen |
| 5,911,127 A | 6/1999 | Tulpule |
| 5,918,200 A | 6/1999 | Tsutsui et al. |
| 5,924,486 A | 7/1999 | Ehlers et al. |
| 5,930,773 A | 7/1999 | Crooks et al. |
| 5,960,381 A | 9/1999 | Singers et al. |
| 5,963,458 A | 10/1999 | Cascia |
| 6,005,577 A | 12/1999 | Breitlow |
| 6,006,142 A | 12/1999 | Seem et al. |
| 6,012,152 A | 1/2000 | Douik et al. |
| 6,021,401 A | 2/2000 | Oravetz et al. |
| 6,029,092 A | 2/2000 | Stein |
| 6,058,161 A | 5/2000 | Anderson et al. |
| 6,064,310 A | 5/2000 | Busak et al. |
| 6,067,083 A | 5/2000 | Glen et al. |
| 6,104,963 A | 8/2000 | Cebasek et al. |
| 6,122,603 A | 9/2000 | Budike, Jr. |

(56) References Cited

U.S. PATENT DOCUMENTS

| | | |
|---|---|---|
| 6,122,605 A | 9/2000 | Drees et al. |
| 6,141,595 A | 10/2000 | Gloudeman et al. |
| 6,148,306 A | 11/2000 | Seidl et al. |
| 6,157,943 A | 12/2000 | Meyer |
| 6,161,764 A | 12/2000 | Jatnieks |
| 6,178,362 B1 | 1/2001 | Woolard et al. |
| 6,185,483 B1 | 2/2001 | Drees |
| 6,216,956 B1 | 4/2001 | Ehlers et al. |
| 6,219,590 B1 | 4/2001 | Bernaden, III et al. |
| 6,223,544 B1 | 5/2001 | Seem |
| 6,253,121 B1 | 6/2001 | Cline et al. |
| 6,265,843 B1 | 7/2001 | West et al. |
| 6,269,650 B1 | 8/2001 | Shaw |
| 6,282,910 B1 | 9/2001 | Helt |
| 6,296,193 B1 | 10/2001 | West et al. |
| 6,324,659 B1 | 11/2001 | Pierro |
| 6,366,832 B2 | 4/2002 | Lomonaco et al. |
| 6,366,889 B1 | 4/2002 | Zaloom |
| 6,369,716 B1 | 4/2002 | Abbas et al. |
| 6,389,331 B1 | 5/2002 | Jensen et al. |
| 6,408,228 B1 | 6/2002 | Seem et al. |
| 6,415,276 B1 | 7/2002 | Heger et al. |
| 6,415,617 B1 | 7/2002 | Seem |
| 6,456,622 B1 | 9/2002 | Skaanning et al. |
| 6,477,439 B1 | 11/2002 | Bernaden, III et al. |
| 6,535,865 B1 | 3/2003 | Skaaning et al. |
| 6,556,950 B1 | 4/2003 | Schwenke et al. |
| 6,577,962 B1 | 6/2003 | Afshari |
| 6,594,554 B1 | 7/2003 | Seem et al. |
| 6,622,264 B1 | 9/2003 | Bliley et al. |
| 6,626,366 B2 | 9/2003 | Kayahara et al. |
| 6,631,299 B1 | 10/2003 | Patel et al. |
| 6,633,782 B1 | 10/2003 | Schleiss et al. |
| 6,651,034 B1 | 11/2003 | Hedlund et al. |
| 6,676,831 B2 | 1/2004 | Wolfe |
| 6,684,208 B2 | 1/2004 | Kil et al. |
| 6,687,685 B1 | 2/2004 | Sadeghi et al. |
| 6,757,668 B1 | 6/2004 | Goebel et al. |
| 6,785,592 B1 | 8/2004 | Smith et al. |
| 6,816,811 B2 | 11/2004 | Seem |
| 6,834,208 B2 | 12/2004 | Gonzales et al. |
| 6,853,882 B2 | 2/2005 | Dudley |
| 6,862,499 B1 | 3/2005 | Cretella et al. |
| 6,862,540 B1 | 3/2005 | Welch et al. |
| 6,865,449 B2 | 3/2005 | Dudley |
| 6,891,536 B2 | 5/2005 | Smith |
| 6,937,909 B2 | 8/2005 | Seem |
| 6,944,524 B2 | 9/2005 | Shier et al. |
| 6,968,295 B1 | 11/2005 | Carr |
| 6,973,793 B2 | 12/2005 | Douglas et al. |
| 6,996,508 B1 | 2/2006 | Culp et al. |
| 7,031,880 B1 | 4/2006 | Seem et al. |
| 7,036,559 B2 | 5/2006 | Stanimirovic |
| 7,043,661 B2 | 5/2006 | Valadarsky et al. |
| 7,096,387 B2 | 8/2006 | Durrant et al. |
| 7,110,919 B2 | 9/2006 | Brindac et al. |
| 7,113,890 B2 | 9/2006 | Frerichs et al. |
| 7,113,988 B2 | 9/2006 | Chirashnya et al. |
| 7,124,637 B2 | 10/2006 | Singhal et al. |
| 7,181,648 B2 | 2/2007 | Bjorsne et al. |
| 7,212,887 B2 | 5/2007 | Shah et al. |
| 7,216,021 B2 | 5/2007 | Matsubara et al. |
| 7,218,974 B2 | 5/2007 | Rumi et al. |
| 7,222,800 B2 | 5/2007 | Wruck |
| 7,225,089 B2 | 5/2007 | Culp et al. |
| 7,231,281 B2 | 6/2007 | Costa |
| 7,246,039 B2 | 7/2007 | Moorhouse |
| 7,251,582 B2 | 7/2007 | Singh et al. |
| 7,257,744 B2 | 8/2007 | Sabet et al. |
| 7,284,372 B2 | 10/2007 | Crow |
| 7,356,548 B1 | 4/2008 | Culp et al. |
| 7,409,303 B2 | 8/2008 | Yeo et al. |
| 7,434,413 B2 | 10/2008 | Wruck |
| 7,444,251 B2 | 10/2008 | Nikovski et al. |
| 7,451,003 B2 | 11/2008 | Chester et al. |
| 7,451,017 B2 | 11/2008 | McNally |
| 7,519,485 B2 | 4/2009 | MacGregor |
| 7,552,033 B1 | 6/2009 | Culp et al. |
| 7,567,844 B2 | 7/2009 | Thomas et al. |
| 7,567,888 B2 | 7/2009 | Chang et al. |
| 7,577,550 B2 | 8/2009 | Ozonat et al. |
| 7,578,734 B2 | 8/2009 | Ahmed et al. |
| 7,636,613 B2 | 12/2009 | Borah et al. |
| 7,685,830 B2 | 3/2010 | Thybo et al. |
| 7,698,233 B1 | 4/2010 | Edwards et al. |
| 7,705,269 B2 | 4/2010 | Daniel |
| 7,729,789 B2 | 6/2010 | Blevins et al. |
| 7,822,709 B2 | 10/2010 | Godwin |
| 7,827,813 B2 | 11/2010 | Seem |
| 7,844,366 B2 | 11/2010 | Singh |
| 7,844,370 B2 | 11/2010 | Pollack et al. |
| 7,873,442 B2 | 1/2011 | Tsui |
| 7,873,485 B2 | 1/2011 | Castelli et al. |
| 7,880,602 B2 | 2/2011 | Kasamatsu |
| 7,881,889 B2 | 2/2011 | Barclay et al. |
| 7,908,126 B2 | 3/2011 | Bahel et al. |
| 7,918,407 B2 | 4/2011 | Patch |
| 7,962,536 B2 | 6/2011 | Culp et al. |
| 7,965,178 B1 | 6/2011 | Schmuttor et al. |
| 8,027,742 B2 | 9/2011 | Seem et al. |
| 8,103,465 B2 | 1/2012 | Brzezowski et al. |
| 8,172,154 B1 | 5/2012 | Figley et al. |
| 8,180,664 B2 | 5/2012 | Shan |
| 8,200,344 B2 | 6/2012 | Li et al. |
| 8,200,345 B2 | 6/2012 | Li et al. |
| 8,200,449 B2 | 6/2012 | Mark |
| 8,200,456 B2 | 6/2012 | Marik et al. |
| 8,219,250 B2 | 7/2012 | Dempster et al. |
| 8,239,168 B2 | 8/2012 | House et al. |
| 8,374,725 B1 | 2/2013 | Ols |
| 8,417,392 B2 | 4/2013 | Higgins |
| 8,543,244 B2 | 9/2013 | Keeling et al. |
| 8,682,612 B2 | 3/2014 | Mousavi et al. |
| 8,826,165 B2 | 9/2014 | Harrod et al. |
| 9,196,009 B2 | 11/2015 | Drees et al. |
| 9,429,927 B2 * | 8/2016 | Nesler ............... G01R 21/133 |
| 10,261,485 B2 | 4/2019 | Drees et al. |
| 2001/0045960 A1 | 11/2001 | Keeley |
| 2002/0007388 A1 | 1/2002 | Bannai et al. |
| 2002/0010563 A1 | 1/2002 | Ratteree et al. |
| 2002/0016639 A1 | 2/2002 | Smith et al. |
| 2002/0030114 A1 | 3/2002 | Kayahara et al. |
| 2002/0038169 A1 | 3/2002 | Cline et al. |
| 2002/0045995 A1 | 4/2002 | Shimazaki et al. |
| 2002/0055820 A1 | 5/2002 | Scannell |
| 2002/0138782 A1 | 9/2002 | Durrant et al. |
| 2002/0152298 A1 | 10/2002 | Kikta et al. |
| 2002/0178047 A1 | 11/2002 | Or et al. |
| 2002/0183988 A1 | 12/2002 | Skaanning et al. |
| 2003/0014160 A1 | 1/2003 | Nordquist et al. |
| 2003/0028350 A1 | 2/2003 | Seem |
| 2003/0031164 A1 | 2/2003 | Nabkel et al. |
| 2003/0074304 A1 | 4/2003 | Okada |
| 2003/0079483 A1 | 5/2003 | Komatsu et al. |
| 2003/0090371 A1 | 5/2003 | Teowee et al. |
| 2003/0093186 A1 | 5/2003 | Patterson et al. |
| 2003/0105556 A1 | 6/2003 | Enis et al. |
| 2003/0114942 A1 | 6/2003 | Varone et al. |
| 2003/0135339 A1 | 7/2003 | Gristina et al. |
| 2003/0172087 A1 | 9/2003 | Godwin |
| 2003/0177705 A1 | 9/2003 | Forbis et al. |
| 2003/0229572 A1 | 12/2003 | Raines et al. |
| 2004/0002776 A1 | 1/2004 | Bickford |
| 2004/0010733 A1 | 1/2004 | S. et al. |
| 2004/0024494 A1 | 2/2004 | Bayoumi et al. |
| 2004/0072535 A1 | 4/2004 | Schneider et al. |
| 2004/0078094 A1 | 4/2004 | Nagatsuka et al. |
| 2004/0102924 A1 | 5/2004 | Jarrell et al. |
| 2004/0102937 A1 | 5/2004 | Ibrahim |
| 2004/0143474 A1 | 7/2004 | Haeberle et al. |
| 2004/0143510 A1 | 7/2004 | Haeberle et al. |
| 2004/0143810 A1 | 7/2004 | Ahmed et al. |
| 2004/0153819 A1 | 8/2004 | Bjorsne et al. |
| 2004/0158417 A1 | 8/2004 | Bonet |

(56) References Cited

U.S. PATENT DOCUMENTS

| | | |
|---|---|---|
| 2004/0164690 A1 | 8/2004 | Degner et al. |
| 2004/0186630 A1 | 9/2004 | Shier et al. |
| 2004/0225513 A1 | 11/2004 | Haeberle et al. |
| 2004/0267385 A1 | 12/2004 | Lingemann |
| 2004/0267395 A1 | 12/2004 | Discenzo et al. |
| 2005/0006488 A1 | 1/2005 | Stanimirovic |
| 2005/0033458 A1 | 2/2005 | Brindac et al. |
| 2005/0033481 A1 | 2/2005 | Budhraja et al. |
| 2005/0040250 A1 | 2/2005 | Wruck |
| 2005/0096797 A1 | 5/2005 | Matsubara et al. |
| 2005/0114311 A1 | 5/2005 | Cheng et al. |
| 2005/0159847 A1 | 7/2005 | Shah et al. |
| 2005/0160324 A1 | 7/2005 | Przytula et al. |
| 2005/0192680 A1 | 9/2005 | Cascia et al. |
| 2005/0192915 A1 | 9/2005 | Ahmed et al. |
| 2005/0201312 A1* | 9/2005 | Archacki, Jr. ......... H04H 60/32 370/312 |
| 2005/0256661 A1 | 11/2005 | Salsbury et al. |
| 2005/0278047 A1 | 12/2005 | Ahmed |
| 2006/0015195 A1 | 1/2006 | Lehman et al. |
| 2006/0058900 A1 | 3/2006 | Johanson et al. |
| 2006/0058923 A1 | 3/2006 | Kruk et al. |
| 2006/0090467 A1 | 5/2006 | Crow |
| 2006/0106739 A1 | 5/2006 | Holzbauer et al. |
| 2006/0125422 A1 | 6/2006 | Costa |
| 2006/0144057 A1 | 7/2006 | You et al. |
| 2006/0167591 A1 | 7/2006 | McNally |
| 2006/0171396 A1 | 8/2006 | Singh et al. |
| 2006/0173256 A1 | 8/2006 | Ridder et al. |
| 2006/0184326 A1 | 8/2006 | McNally et al. |
| 2006/0186214 A1 | 8/2006 | Simon et al. |
| 2006/0206240 A1 | 9/2006 | Tsui |
| 2006/0224254 A1 | 10/2006 | Rumi et al. |
| 2006/0259285 A1 | 11/2006 | Bahel et al. |
| 2006/0276938 A1* | 12/2006 | Miller .................... G06Q 50/06 700/295 |
| 2007/0006124 A1 | 1/2007 | Ahmed et al. |
| 2007/0023533 A1 | 2/2007 | Liu |
| 2007/0061046 A1 | 3/2007 | Mairs et al. |
| 2007/0067062 A1 | 3/2007 | Mairs et al. |
| 2007/0139183 A1 | 6/2007 | Kates |
| 2007/0143045 A1 | 6/2007 | MacGregor |
| 2007/0225868 A1 | 9/2007 | Terlson et al. |
| 2007/0244573 A1 | 10/2007 | McFarland |
| 2007/0282547 A1 | 12/2007 | Howell et al. |
| 2008/0028778 A1 | 2/2008 | Millet |
| 2008/0033674 A1 | 2/2008 | Nikovski et al. |
| 2008/0054082 A1 | 3/2008 | Evans et al. |
| 2008/0082183 A1 | 4/2008 | Judge |
| 2008/0097651 A1 | 4/2008 | Shah et al. |
| 2008/0114499 A1* | 5/2008 | Hakim ................... G06Q 50/06 700/291 |
| 2008/0147465 A1 | 6/2008 | Raines et al. |
| 2008/0171396 A1 | 7/2008 | Fung et al. |
| 2008/0172258 A1 | 7/2008 | Weger et al. |
| 2008/0179408 A1 | 7/2008 | Seem |
| 2008/0183424 A1 | 7/2008 | Seem |
| 2008/0231437 A1 | 9/2008 | Singhal et al. |
| 2008/0275674 A1 | 11/2008 | Reghetti et al. |
| 2008/0277486 A1 | 11/2008 | Seem et al. |
| 2008/0281663 A1* | 11/2008 | Hakim ................... B60L 53/665 705/7.25 |
| 2008/0288123 A1 | 11/2008 | Krishnan et al. |
| 2008/0300963 A1 | 12/2008 | Seetharaman et al. |
| 2009/0012654 A1 | 1/2009 | Culp et al. |
| 2009/0076790 A1 | 3/2009 | Fein et al. |
| 2009/0078401 A1 | 3/2009 | Cichanowicz |
| 2009/0083583 A1 | 3/2009 | Seem et al. |
| 2009/0099889 A1 | 4/2009 | Okamoto et al. |
| 2009/0105846 A1 | 4/2009 | Hesse et al. |
| 2009/0106178 A1 | 4/2009 | Chu |
| 2009/0112522 A1 | 4/2009 | Rasmussen |
| 2009/0132096 A1 | 5/2009 | Swarztrauber et al. |
| 2009/0138203 A1 | 5/2009 | Iossifov et al. |
| 2009/0204267 A1 | 8/2009 | Sustaeta et al. |
| 2009/0216393 A1 | 8/2009 | Schimert |
| 2009/0216469 A1 | 8/2009 | Marik et al. |
| 2009/0307034 A1* | 12/2009 | Duff ....................... G06Q 10/04 705/7.39 |
| 2009/0308941 A1 | 12/2009 | Patch |
| 2009/0327890 A1 | 12/2009 | Mertz et al. |
| 2010/0004882 A1 | 1/2010 | Chu et al. |
| 2010/0042453 A1 | 2/2010 | Scaramellino et al. |
| 2010/0049676 A1 | 2/2010 | Devitt et al. |
| 2010/0063645 A1* | 3/2010 | Brown .................. G06Q 10/04 700/296 |
| 2010/0070907 A1 | 3/2010 | Harrod et al. |
| 2010/0082161 A1 | 4/2010 | Patch |
| 2010/0106316 A1 | 4/2010 | Curry et al. |
| 2010/0106319 A1 | 4/2010 | Grohman et al. |
| 2010/0106321 A1 | 4/2010 | Hadzidedic |
| 2010/0106328 A1 | 4/2010 | Li et al. |
| 2010/0106331 A1 | 4/2010 | Li et al. |
| 2010/0114385 A1 | 5/2010 | Dempster et al. |
| 2010/0207951 A1 | 8/2010 | Plaisted et al. |
| 2010/0211222 A1 | 8/2010 | Ghosn |
| 2010/0241549 A1* | 9/2010 | Papavasiliou .......... G06Q 10/06 705/37 |
| 2010/0257108 A1 | 10/2010 | Skeels et al. |
| 2010/0274366 A1 | 10/2010 | Fata et al. |
| 2010/0280774 A1 | 11/2010 | Ewing et al. |
| 2010/0283606 A1 | 11/2010 | Tsypin et al. |
| 2010/0286937 A1 | 11/2010 | Hedley et al. |
| 2010/0324741 A1 | 12/2010 | House et al. |
| 2010/0324962 A1 | 12/2010 | Nesler et al. |
| 2011/0029422 A1 | 2/2011 | Rey |
| 2011/0046970 A1 | 2/2011 | Fontenot |
| 2011/0061015 A1 | 3/2011 | Drees et al. |
| 2011/0066299 A1 | 3/2011 | Gray et al. |
| 2011/0119042 A1 | 5/2011 | Johnson et al. |
| 2011/0178977 A1 | 7/2011 | Drees |
| 2011/0204720 A1 | 8/2011 | Ruiz et al. |
| 2011/0231320 A1 | 9/2011 | Irving |
| 2011/0246381 A1 | 10/2011 | Fitch et al. |
| 2011/0285656 A1 | 11/2011 | Yaksick et al. |
| 2011/0320045 A1 | 12/2011 | Salsbury et al. |
| 2012/0072039 A1 | 3/2012 | Anderson et al. |
| 2012/0271576 A1 | 10/2012 | Kamel et al. |
| 2013/0103201 A1 | 4/2013 | Huizenga et al. |
| 2013/0204443 A1* | 8/2013 | Steven ................... G06Q 50/06 700/286 |
| 2014/0172400 A1 | 6/2014 | Majewski et al. |

FOREIGN PATENT DOCUMENTS

| | | |
|---|---|---|
| JP | 10-047738 A | 2/1998 |
| JP | 06-079426 A | 3/2006 |
| JP | 2006-079426 A | 3/2006 |
| SU | 535103 | 11/1976 |
| WO | WO-00/68744 A1 | 11/2000 |
| WO | WO-2009/012269 A2 | 1/2009 |
| WO | WO-2009/012282 A2 | 1/2009 |

OTHER PUBLICATIONS

Office Action on U.S. Appl. No. 14/996,206 dated May 19, 2018. 16 pages.

Andersen, Stochastic Modeling of Energy Systems, Technical University of Denmark, Department of Informatics and Mathematical Modeling, 2001, 212 pages.

ASHRAE Guideline 14-2002, Measurement of Energy and Demand Savings, 2002, 170 pages.

ASHRAE Standard 90.1-2004, Energy Standard for Buildings Except Low-Rise Residential Buildings, 2004, 4 pages.

ASHRAE Standard, Energy Standard for Buildings Except Low-Rise Residential Buildings I-P Edition, ANSI/ASHRAE/IESNA Standard 90.1-2004, 4 pages.

Barnett et al., Outliers in Statistical Data, 1994, 14 pages.

Cowan, Review of Recent Commercial Roof Top Unit Field Studies in the Pacific Northwest and California, Oct. 8, 2004, 18 pages.

(56) References Cited

OTHER PUBLICATIONS

DOE Federal Emergency Management Program, Actions You Can Take to Reduce Cooling Costs, http://www1.eere.energy.gov/femp/pdfs/om_cooling.pdf, May 2005, 8 pages.
Edelson, Building Automation Security in Office Building, Elsevier, 2004, 3 pages.
Final Office Action on U.S. Appl. No. 13/167,571, dated Jan. 29, 2015, 6 pages.
Final Office Action on U.S. Appl. No. 13/485,682 dated Sep. 1, 2015, 29 pages.
Final Office Action on U.S. Appl. No. 13/252,092 dated Apr. 23, 2015, 12 pages.
Final Office Action on U.S. Appl. No. 13/439,779 dated Apr. 2, 2015, 15 pages.
Final Office Action on U.S. Appl. No. 13/439,779, dated May 26, 2016, 14 pages.
Final Office Action on U.S. Appl. No. 14/021,948 dated Jul. 14, 2015, 8 pages.
Financial Times Energy, Inc. Economizers, Energy Design Resources, taken from http://www.energydesignresources.com/resource/28/, Jan. 2007, 32 pages.
Geweke, Efficient Simulation from the Multivariate Normal and Student-T Distributions Subject to Linear Constraints and the Evaluation of Constraint Probabilities, Computing Science and Statistics, Seattle, Apr. 22-24, 1991, 14 pages.
House et al., An Expert Rule Set for Fault Detection in Air-Handling Units, ASHRAE Transactions, 2001, 32 pages.
Iglewicz et al., vol. 16: How to Detect and Handle Outliers, The ASQC Basic References in Quality Control: Statistical Techniques, 1993, 15 pages.
International Performance Measurement & Verification Protocol, Concepts and Options for Determining Energy and Water Savings, Mar. 2002, 93 pages.
International Search Report and Written Opinion for International Patent Application No. PCT/US2008/070091, dated Sep. 30, 2009, 13 pages.
International Search Report and Written Opinion for International Patent Application No. PCT/US2008/070118, dated Oct. 19, 2009, 11 pages.
International Search Report and Written Opinion for International Patent Application No. PCT/US2011/024079, dated Oct. 24, 2011, 9 pages.
Jaehn, The Zone Control Chart, Quality Progress, Jul. 1991, 6 pages.
Kastner et al., Communication Systems for Building Automation and Control, 2005, 26 pages.
Katipamula et al., Methods for Fault Detection, Diagnostics, and Prognostics for Building Systems—A Review, Part I, American Society of Heating, 2005, 24 pages.
Kim et al., Performance Enhancement of Cyclostationarity Detector by Utilizing Multiple Cyclic Frequencies of OFDM Signals, IEEE DySPAN, 2010, 8 pages.
Leblanc, Sur l'electrification des Chemins de fer au Moyen de Courants Alternatifs de Frequence Elevee, Revue Generale de l'ectricite, 1922, 4 pages.
Leyva et al., MPPT of Photovoltaic Systems using Extremum-Seeking Control, IEEE Transactions on Aerospace and Electronic Systems, Jan. 2006, 10 pages.
Li et al., Extremum Seeking Control of a Tunable Thermoacoustic Cooler, IEEE Transactions on Control Systems Technology, Jul. 2005, 10 pages.
Martin et al., Supervisory Control for Energy Savings and Thermal Comfort in Commercial Building HVAC Systems, AAAI Technical Report, 2002, 8 pages.
Mathews et al., A Tool for Integrated HVAC, Building, Energy, and Control Analysis Part 1: Overview of Quick Control, 1999, 21 pages.
Nelson, Best Target Value for a Production Process, Journal of Quality Technology, Apr. 1978, 4 pages.
Non-Final Office Action on U.S. Appl. No. 13/167,571, dated Aug. 27, 2014, 5 pages.
Non-Final Office Action on U.S. Appl. No. 13/485,682, dated Feb. 6, 2015, 24 pages.
Non-Final Office Action on U.S. Appl. No. 14/320,203 dated Sep. 15, 2015, 16 pages.
Non-Final Office Action on U.S. Appl. No. 13/252,092 dated Sep. 29, 2014, 11 pages.
Non-Final Office Action on U.S. Appl. No. 13/439,779 dated Nov. 3, 2015, 13 pages.
Non-Final Office Action on U.S. Appl. No. 13/439,779 dated Sep. 10, 2014, 13 pages.
Non-Final Office Action on U.S. Appl. No. 14/021,948 dated Mar. 5, 2015, 13 pages.
Non-Final Office Action on U.S. Appl. No. 14/021,948 dated Oct. 2, 2014, 17 pages.
Non-Final Office Action on U.S. Appl. No. 14/091,261 dated Aug. 28, 2015, 8 pages.
Non-Final Office Action on U.S. Appl. No. 14/320,203 dated Mar. 31, 2016, 33 pages.
Notice of Allowance for U.S. Appl. No. 12/819,977, dated Jul. 30, 2013, 9 pages.
Notice of Allowance for U.S. Appl. No. 12/949,660 dated May 13, 2013, 6 pages.
Notice of Allowance for U.S. Appl. No. 13/023,392, dated May 9, 2013, 6 pages.
Notice of Allowance on U.S. Appl. No. 13/167,571 dated Aug. 3, 2015, 8 pages.
Notice of Allowance on U.S. Appl. No. 12/916,145 dated Mar. 13, 2014, 8 pages.
Notice of Allowance on U.S. Appl. No. 13/246,644 dated Feb. 3, 2014, 6 pages.
Notice of Allowance on U.S. Appl. No. 13/252,092 dated Nov. 2, 2015, 9 pages.
Notice of Allowance on U.S. Appl. No. 13/485,682 dated Mar. 14, 2016, 13 pages.
Notice of Allowance on U.S. Appl. No. 14/021,971 dated Feb. 24, 2015, 7 pages.
Notice of Allowance on U.S. Appl. No. 14/021948 dated Feb. 1, 2016, 5 pages.
Office Action for U.S. Appl. No. 11/699,859, dated Mar. 15, 2010, 12 pages.
Office Action for U.S. Appl. No. 11/699,860, dated Aug. 20, 2009, 18 pages.
Office Action for U.S. Appl. No. 11/699,860, dated Jun. 9, 2010, 9 pages.
Office Action for U.S. Appl. No. 12/819,977, dated Feb. 13, 2013, 40 pages.
Office Action for U.S. Appl. No. 12/819,977, dated Sep. 13, 2012, 21 pages.
Office Action for U.S. Appl. No. 12/916,145, dated Mar. 14, 2013, 21 pages.
Office Action for U.S. Appl. No. 12/916,145, dated Oct. 8, 2013, 23 pages.
Office Action for U.S. Appl. No. 12/949,660, dated Nov. 7, 2012, 33 pages.
Office Action for U.S. Appl. No. 13/023,392, dated Nov. 7, 2012, 31 pages.
Office Action for U.S. Appl. No. 13/077,508, dated Dec. 3, 2013, 39 pages.
Office Action for U.S. Appl. No. 13/077,508, dated May 22, 2013, 26 pages.
Office Action for U.S. Appl. No. 13/167,571, dated Jun. 26, 2013, 40 pages.
Office Action for U.S. Appl. No. 13/167,571, dated Nov. 5, 2013, 43 pages.
Office Action for U.S. Appl. No. 13/246,644, dated Oct. 4, 2013, 15 pages.
Office Action for U.S. Appl. No. 13/252,092, dated Nov. 19, 2013, 12 pages.
Office Action on U.S. Appl. No. 13/252,092 dated May 12, 2014, 16 pages.

(56) References Cited

OTHER PUBLICATIONS

Office Action on U.S. Appl. No. 14/021,971 dated Oct. 8, 2014. 21 pages.
Quesenberry, SPC Methods of Quality Improvement, 1997, 49 pages.
Rosner, Percentage Points for a Generalized ESD Many-Outlier Procedure, Technometrics, May 1983, 10 pages.
Salsbury, A Controller for HVAC Systems with Embedded Fault Detection Capabilities Based on Simulation Models, Sep. 1999, 8 pages.
Sanchez-Pena et al., "Iterative Identification and Control Design: Methodology and Applications," Identification and Control: The Gap Between Theory and Practice (2007), Chapter 9, 34 pages.
Sane et al., Building HVAC Control Systems—Role of Controls and Optimization, Jun. 2006, 6 pages.
Shakeri et al., "Optimal and Near-Optimal Algorithms for Multiple Fault Diagnosis with Unreliable Tests", IEEE, 1996,pp. 473-482.
Shengwei et al., Parameter Estimation of Internal Thermal Mass of Building Dynamic Models Using Genetic Algorithm:, Elsevier, vol. 47, Issues 13,Aug. 14, 2006, pp. 1927-1941.
Sreedharan et al., Comparison of Chiller Models for Use in Model-Based Fault Detection, eScholarship, 2001, 12 pages.
Supplemental Notice of Allowance on U.S. Appl. No. 13/252,092 dated Nov. 16, 2015, 2 pages.
Teel, Lyapunov Methods in Nonsmooth Optimization, Part I: Quasi-Newton Algorithms for Lipschitz, Regular Functions, Dec. 2000, 8 pages.
Teel, Lyapunov Methods in Nonsmooth Optimization, Part II: Persistenly Exciting Finite Differences, Dec. 2000, 8 pages.
Titica et al., Adaptive Extremum Seeking Control of Fed-Batch Bioreactors, European Journal of Control, 2003, 14 pages.
Tudoroiu et al., "Fault Detection and Diagnostic of Valve Actuators in HVAC System", IEEE, 2005, pp. 1281-1286.
U.S. Department of Energy, International Performance Measurement & Verification Protocol, 2002, DOE/GO-102002-1554, 93 pages.
U.S. Department of Energy, M&V Guidelines: Measurement and Verification for Federal Energy Projects, Apr. 2008, 306 pages.
Uraikul et al., Artificial Intelligence for Monitoring and Supervisory Control of Process Systems, 2006, 17 pages.
U.S. Notice of Allowance on U.S. Appl. No. 14/091,261 dated Apr. 25, 2016, 8 pages.
U.S. Office Action on U.S. Appl. No. 15/016,243 dated Jun. 23, 2016.
Wong et al., Building Automation in the 21st Century, IEEE, 1997, 6 pages.
Xu et al., "A Simplified Dynamic Model for Existing Buildings Using CTF and Thermal Network Models", Elsevier, vol. 47, Issue 9, Sep. 2008, pp. 1249-1262.
Notice of Allowance on U.S. Appl. No. 13/439,779 dated Nov. 18, 2016, 12 pages.
Notice of Allowance on U.S. Appl. No. 14/320,203 dated Oct. 4, 2016, 7 pages.
Notice of Allowance on U.S. Appl. No. 15/016,243 dated Oct. 12, 2016, 8 pages.
Non-Final Office Action on U.S. Appl. No. 14/273,381 dated Sep. 27, 2016.
Final Office Action on U.S. Appl. No. 14/996,206 dated Dec. 31, 2018. 18 pages.
Non-Final Office Action on U.S. Appl. No. 15/199,622 dated Nov. 2, 2018. 11 pages.
Brown et al., Techniques for Testing the Constancy of Regression Relationships over Time. Journal of the Royal Statistical Society. Series B (Methodological). vol. 37, No. 2, 1975, pp. 149-192.
Galpin et al., The Use of Recursive Residuals in Checking Model fit in Linear Regression, The American Statistician, pp. 94-105.

\* cited by examiner

Tenant Energy Portal — Highrise "A" Building

Welcome Username | My Account | Help | Logout
English
Wednesday, May 5, 2010

Tabs: Home | Building History | Energy Comparison

Tenant Name Space Details — This Week

| Period | Usage (kWh) | Area (sq. ft.) | kWh/sq. ft. | $/sq. ft. |
|---|---|---|---|---|
| This Week | 2807 | 5300 | 0.53 | 0.005 |
| Last Week | 2500 | 5300 | 0.47 | 0.004 |
| This Week Last Year | 3200 | 5300 | 0.60 | 0.005 |

| Period | Usage (kWh) | Occupants | kWh/person | $/person |
|---|---|---|---|---|
| This Week | 2807 | 35 | 80.2 | 7.22 |
| Last Week | 2500 | 35 | 71.4 | 6.43 |
| This Week Last Year | 3200 | 32 | 100 | 9.00 |

| Period | Usage (kWh) | Man-Hours | kWh/Man-Hr | $/Man-Hr |
|---|---|---|---|---|
| This Week | 2807 | 45 | 62.38 | 5.61 |
| Last Week | 2500 | 45 | 55.56 | 5.00 |
| This Week Last Year | 3200 | 50 | 64.00 | 5.76 |

FIG. 5D

SMART BUILDING MANAGER

CROSS-REFERENCE TO RELATED PATENT APPLICATIONS

This application is a continuation of U.S. application Ser. No. 14/091,261, filed Nov. 26, 2013, which is a continuation of U.S. application Ser. No. 12/819,977, filed Jun. 21, 2010, which claims the benefit of U.S. Provisional Application No. 61/219,326, filed Jun. 22, 2009, U.S. Provisional Application No. 61/234,217, filed Aug. 14, 2009, and U.S. Provisional Application No. 61/302,854, filed Feb. 9, 2010. The entireties of all of these applications are hereby incorporated by reference.

BACKGROUND

The present invention relates generally to the field of building management systems. The present invention more particularly relates to systems and methods for integrating a building management system with smart grid components and data.

In a smart grid, the switching points in the grid, as well as several other points distributed throughout the grid, include microprocessor driven controls configured to automatically reconfigure the circuits and communicate bi-directional information. The communicated information can be carried over the power distribution grid itself or other communication mediums (e.g., wireless, optical, wired, etc.).

A smart grid is a key element of a comprehensive strategy to increase energy reliability and efficiency, reduce energy costs, and lower greenhouse gas emissions. The large portion of smart grid R&D efforts today are focused on creating the digital communications architecture and distribution management infrastructure connecting power plant and utility-scale energy resources with distributed meters.

SUMMARY

One embodiment of the invention relates to a building manager. The building manager includes a communications interface configured to receive information from a smart energy grid. The building manager further includes an integrated control layer configured to receive inputs from and to provide outputs to a plurality of building subsystems. The integrated control layer includes a plurality of control algorithm modules configured to process the inputs and to determine the outputs. The building manager further includes a fault detection and diagnostics layer configured to use the inputs received from the integrated control layer to detect and diagnose faults. The building manager also includes a demand response layer configured to process the information received from the smart energy grid to determine adjustments to the plurality of control algorithms of the integrated control layer. The fault detection and diagnostics layer may detect and diagnose faults using at least one of statistical analysis, rule-based analysis, and model-based analysis.

The building manager may include an automated measurement and validation layer configured to measure energy use or track energy savings based on representations of the inputs stored in memory according to an international performance management and verification protocol (IPMVP).

The building manager may further include an enterprise applications layer configured to provide services to enterprise level applications for communicating with the integrated control layer, the fault detection and diagnostics layer, the demand response layer, and the automated measurement and validation layer. The enterprise applications layer may include a web services interface configured to receive requests from enterprise applications and to respond to the requests.

The smart energy grid may include at least one of (a) a smart meter configured to receive time-of-use pricing information wherein the information received by the communications interface is the time-of-use pricing information, and (b) energy providers and purchasers configured to provide daily or hourly time-of-use pricing information to the communications interface.

The demand response layer may be configured to curtail energy use of the plurality of building subsystems based on the time-of-use pricing information. The demand response layer may be further configured to receive energy availability information from at least one of a local energy generation source, remote energy generation source, a distributed energy generation source, a local energy storage system, and a remote energy storage system. The demand response layer may yet further be configured to use the energy availability information in its processing of the information received from the smart energy grid to determine the adjustments to the plurality of control algorithms of the integrated control layers. The demand response layer may also be configured to cause a building electrical system to use power from the at least one of a local energy generation source, a distributed energy generation source, a local energy storage system, and a remote energy storage system to power one or more loads normally powered by the smart energy grid. Yet further, the demand response layer may be configured to provide power to the smart energy grid from at least one of a local energy generation source, a distributed energy generation source, a local energy storage system, and a remote energy storage system. The demand response layer may be configured to provide the power to the smart energy grid when the power may be sold to the smart energy grid for a profit. The demand response layer may be configured to compare the time-of-use pricing information to cost information associated with the at least one of a local energy generation source, a distributed energy generation source, a local energy storage system, and a remote energy storage system during its processing. The demand response module may be configured to bi-directionally communicate with the smart energy grid via the communications interface and the demand response module may be configured to communicate data regarding the energy use anticipated by the building management system to the smart energy grid. Processing the information by the demand response layer and received from the smart energy grid may include comparing pricing information to threshold information associated with adjustments for the plurality of control algorithms. The adjustments for the plurality of control algorithms may be tiered or prioritized such that high priority building subsystems and devices are not affected by the time-of-use pricing information to the extent that lower priority building subsystems and devices are affected. The tiering information or prioritization information used by the demand response module may be stored in memory and the building management system may further include a web service configured to receive updates to the tiering information or prioritization information. The web service may be configured to provide information for generating a graphical user interface to a client. The graphical user interface may be configured to prompt a user for updates to the tiering information or prioritization information.

The communications interface may be a power line carrier interface, an Ethernet interface, another wired interface, or a wireless interface. The building manager includes at least one processing circuit and at least one memory device. The integrated control layer, the fault detection and diagnostics layer, and the demand response layer may each be computer code modules stored in the memory device. In other embodiments the computer code modules may be distributed across different memory devices. The computer code modules configure the processing circuit to provide the functions of the integrated control layer, the fault detection and diagnostics layer, and the demand response layer.

The automated measurement and validation layer is configured to validate an energy consumption measurement against data received from another calculation or source. The automated measurement and validation layer may further be configured to store pricing data received from the smart energy grid and to use the stored pricing data to compute an energy cost savings for a control strategy or for a period of time. The automated measurement and validation layer may further be configured to validate the calculated energy cost savings using a standardized energy savings calculation method. The automated measurement and validation layer may be configured to monitor energy consumption for a building based on inputs from building subsystems. In some embodiments the automated measurement and validation layer may complete a calculation of energy consumption for the building without using inputs from a utility meter or power provider. The automated measurement and validation layer may be configured to validate energy use information provided by a utility or meter using the calculation of energy consumption for the building that is calculated without using inputs from the utility meter or power provider. The automated measurement and validation layer may be configured to calculate greenhouse gas emissions for the building. The automated measurement and validation layer may further be configured to convert the calculated greenhouse gas emissions into a tradable credit. The automated measurement and validation layer may yet further be configured to provide information about the tradable credit to a remote source via the communications interface or another communications interface. The automated measurement and validation layer may further be configured to receive at least one of a trade confirmation message and a trade offer message from the remote source via the communications interface or the other communications interface. Yet further, the automated measurement and validation layer may be configured to complete a transaction using the tradable credit and the trade confirmation message or trade offer message from the remote source. The automated measurement and validation layer may be included within the same server as the integrated control layer, the fault detection and diagnostics layer, and the demand response layer.

The integrated control layer may be configured to use inputs from the smart energy grid, building energy loads, and/or building energy storage in a control algorithm configured to reduce energy costs based on the received inputs. The demand response layer may be configured to adjust or affect the control algorithm of the integrated control layer by planning a control strategy based on received real time pricing (RTP) information or forecasted pricing information for energy from a utility. The demand response layer may further be configured to calculate an estimate of demand loads for the building for upcoming time periods based on at least one of historical information, forecasted pricing, scheduled facility control events, and inputs from the building's subsystems. The demand response layer may yet further be configured to provide the calculated estimate of demand loads for the building to the smart energy grid for an energy provider. The building subsystem integration layer may be configured to translate communications from a plurality of disparately protocolled building devices or subsystems for use by the integrated control layer as inputs.

Alternative exemplary embodiments relate to other features and combinations of features as may be generally recited in the claims.

BRIEF DESCRIPTION OF THE FIGURES

The disclosure will become more fully understood from the following detailed description, taken in conjunction with the accompanying figures, wherein like reference numerals refer to like elements, in which:

FIGS. 5A-5D are exemplary graphical user interfaces for a building occupant interface, according to various embodiments.

DETAILED DESCRIPTION OF THE EXEMPLARY EMBODIMENTS

The present invention relates to a building management system configured to improve building efficiency, to enable greater use of renewable energy sources, and to provide more comfortable and productive buildings.

A building management system (BMS) is, in general, hardware and/or software configured to control, monitor, and manage devices in or around a building or building area. BMS subsystems or devices can include heating, ventilation, and air conditioning (HVAC) subsystems or devices, security subsystems or devices, lighting subsystems or devices, fire alerting subsystems or devices, elevator subsystems or devices, other devices that are capable of managing building functions, or any combination thereof.

Figure 1A:
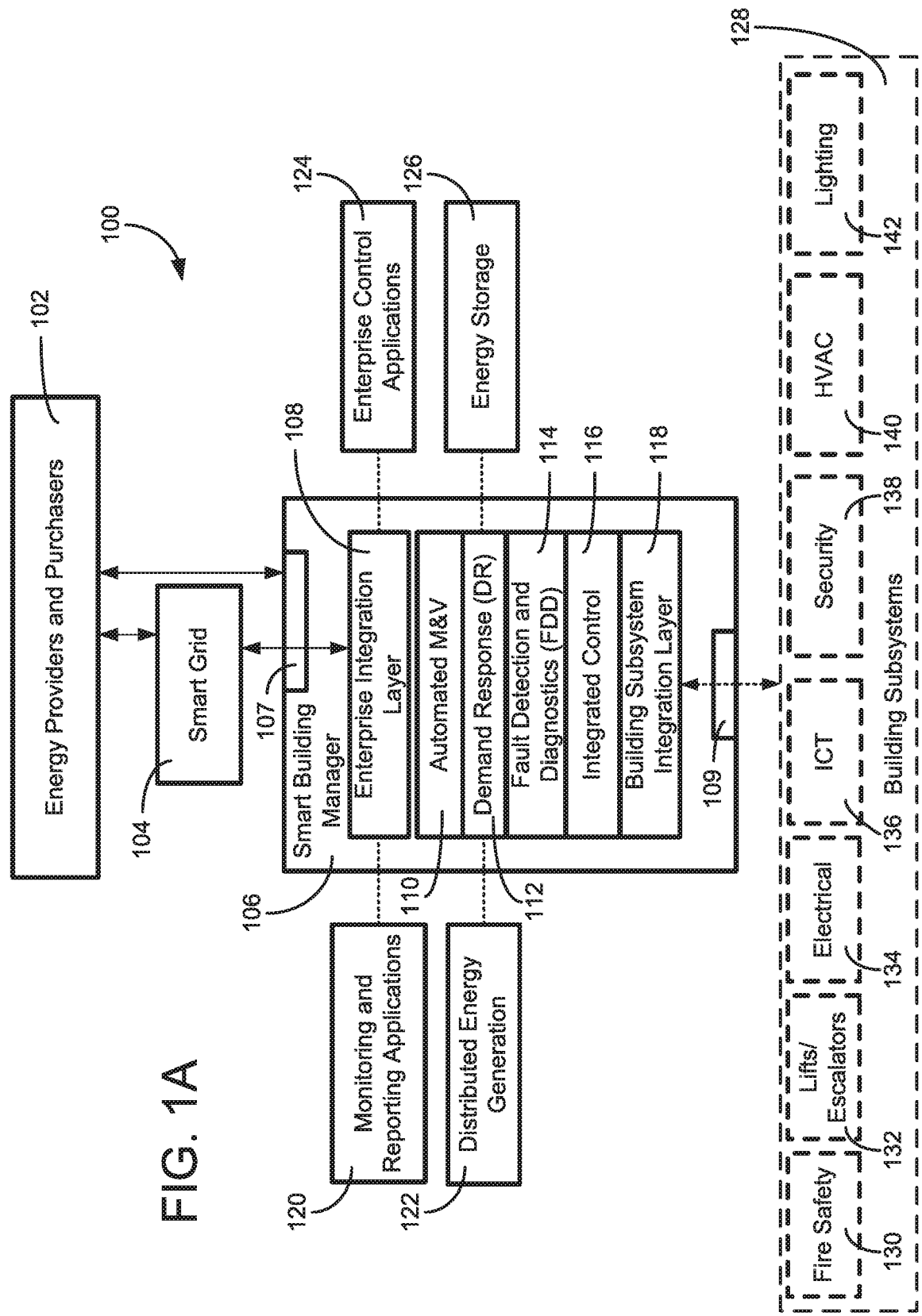
FIG. 1A is a block diagram of a building manager connected to a smart grid and a plurality of building subsystems, according to an exemplary embodiment.

Referring now to FIG. 1A, a block diagram of a system 100 including a smart building manager 106 is shown, according to an exemplary embodiment. Smart building manager 106 is connected to a smart grid 104 and a plurality of building subsystems 128. The building subsystems 128 may include a building electrical subsystem 134, an information communication technology (ICT) subsystem 136, a security subsystem 138, a HVAC subsystem 140, a lighting subsystem 142, a lift/escalators subsystem 132, and a fire safety subsystem 130. The building subsystems 128 can include fewer, additional, or alternative subsystems. For example, building subsystems 128 may also or alternatively include a refrigeration subsystem, an advertising or signage system subsystem, a cooking subsystem, a vending subsystem, or a printer or copy service subsystem. Conventionally these systems are autonomous and managed by separate control systems. The smart building manager described herein is configured to achieve energy consumption and energy demand reductions by integrating the management of the building subsystems.

Each of building subsystems 128 include any number of devices, controllers, and connections for completing their individual functions and control activities. For example, HVAC subsystem 140 may include a chiller, a boiler, any number of air handling units, economizers, field controllers, supervisory controllers, actuators, temperature sensors, or other devices for controlling the temperature within a building. As another example, lighting subsystem 142 may include any number of light fixtures, ballasts, lighting sensors, dimmers, or other devices configured to controllably adjust the amount of light provided to a building space. Security subsystem 138 may include occupancy sensors, video surveillance cameras, digital video recorders, video processing servers, intrusion detection devices, access control devices and servers, or other security-related devices.

In an exemplary embodiment, the smart building manager 106 is configured to include: a communications interface 107 to the smart grid 104 outside the building, an interface 109 to disparate subsystems 128 within a building (e.g., HVAC, lighting security, lifts, power distribution, business, etc.), and an interface to applications 120, 124 (network or local) for allowing user control, and the monitoring and adjustment of the smart building manager 106 or subsystems 128. Enterprise control applications 124 may be configured to provide subsystem-spanning control to a graphical user interface (GUI) or to any number of enterprise-level business applications (e.g., accounting systems, user identification systems, etc.). Enterprise control applications 124 may also or alternatively be configured to provide configuration GUIs for configuring the smart building manager 106. In yet other embodiments enterprise control applications 124 can work with layers 110-118 to optimize building performance (e.g., efficiency, energy use, comfort, or safety) based on inputs received at the interface 107 to the smart grid and the interface 109 to building subsystems 128. In an exemplary embodiment smart building manager 106 is integrated within a single computer (e.g., one server, one housing, etc.). In various other exemplary embodiments the smart building manager 106 can be distributed across multiple servers or computers (e.g., that can exist in distributed locations).

Figure 1B:
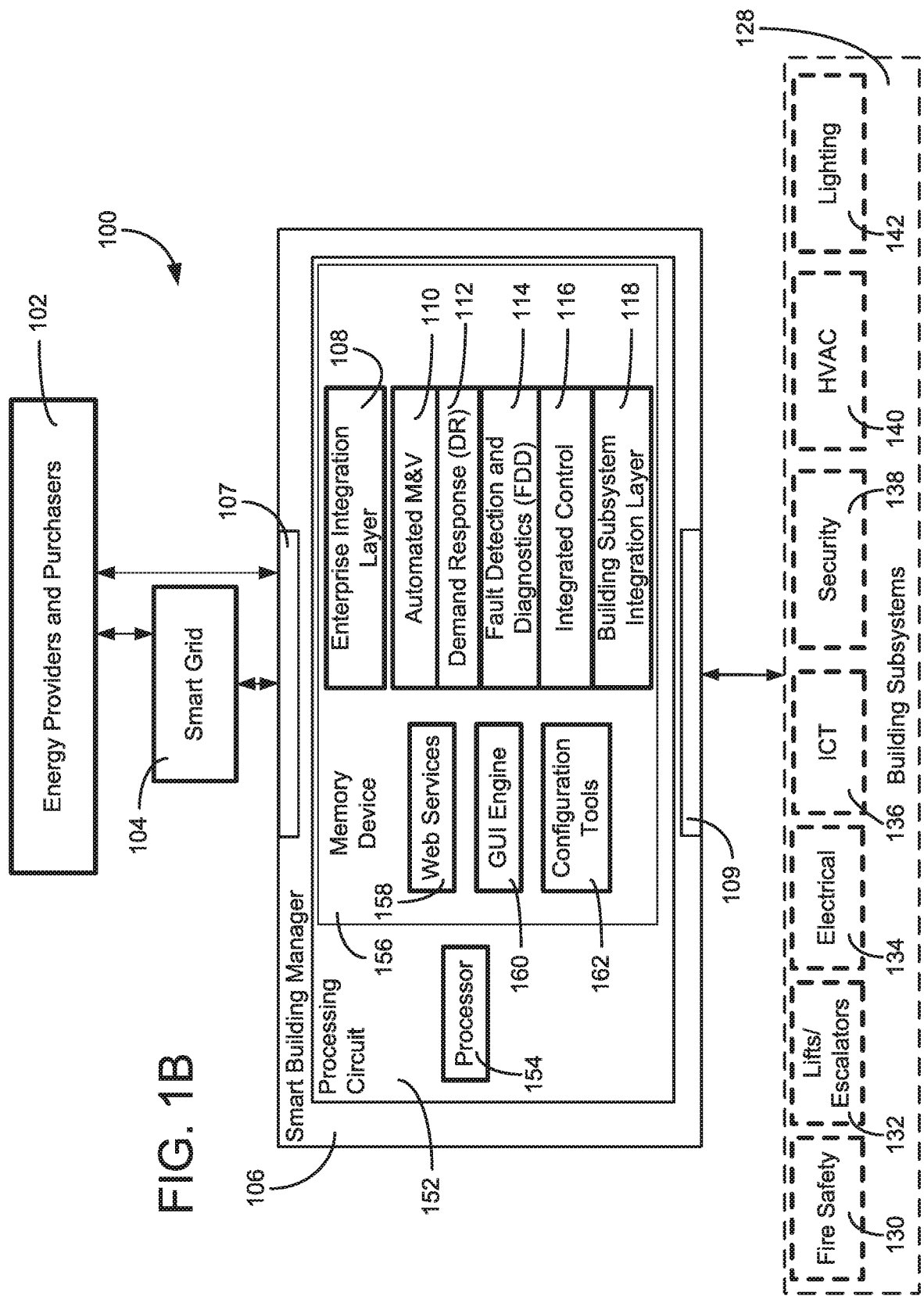
FIG. 1B is a more detailed block diagram of the building manager shown in FIG. 1A, according to an exemplary embodiment.

FIG. 1B illustrates a more detailed view of smart building manager 106, according to an exemplary embodiment. In particular, FIG. 1B illustrates smart building manager 106 as having a processing circuit 152. Processing circuit 152 is shown to include a processor 154 and memory device 156. Processor 154 can be implemented as a general purpose processor, an application specific integrated circuit (ASIC), one or more field programmable gate arrays (FPGAs), a group of processing components, or other suitable electronic processing components. Memory device 156 (e.g., memory, memory unit, storage device, etc.) is one or more devices (e.g., RAM, ROM, Flash memory, hard disk storage, etc.) for storing data and/or computer code for completing and/or facilitating the various processes, layers and modules described in the present application. Memory device 156 may be or include volatile memory or non-volatile memory. Memory device 156 may include database components, object code components, script components, or any other type of information structure for supporting the various activities and information structures described in the present application. According to an exemplary embodiment, memory device 156 is communicably connected to processor 154 via processing circuit 152 and includes computer code for executing (e.g., by processing circuit 152 and/or processor 154) one or more processes described herein.

Communications interfaces 107, 109 can be or include wired or wireless interfaces (e.g., jacks, antennas, transmitters, receivers, transceivers, wire terminals, etc.) for conducting data communications with, e.g., smart grid 104, energy providers and purchasers 102, building subsystems 128, or other external sources via a direct connection or a network connection (e.g., an Internet connection, a LAN, WAN, or WLAN connection, etc.). For example, communications interfaces 107, 109 can include an Ethernet card and port for sending and receiving data via an Ethernet-based communications link or network. In another example, communications interfaces 107, 109 can include a WiFi transceiver for communicating via a wireless communications network. In another example, one or both of interfaces 107, 109 may include cellular or mobile phone communications transceivers. In one embodiment communications interface 107 is a power line communications interface and communications interface 109 is an Ethernet interface. In other embodiments, both communications interface 107 and communications interface 109 are Ethernet interfaces or are the same Ethernet interface. Further, while FIG. 1A shows applications 120 and 124 as existing outside of smart building manager 106, in some embodiments applications 120 and 124 may be hosted within smart building manager 106 generally or memory device 156 more particularly.

Building Subsystem Integration Layer

Referring further to FIG. 1B, the building subsystem integration layer 118 is configured to manage communications between the rest of the smart building manager 106's components and the building subsystems. The building subsystem integration layer 118 may also be configured to manage communications between building subsystems. The building subsystem integration layer 118 may be configured to translate communications (e.g., sensor data, input signals, output signals, etc.) across a plurality of multi-vendor/multi-protocol systems. For example, the building subsystem integration layer 118 may be configured to integrate data from subsystems 128.

Figure 2:
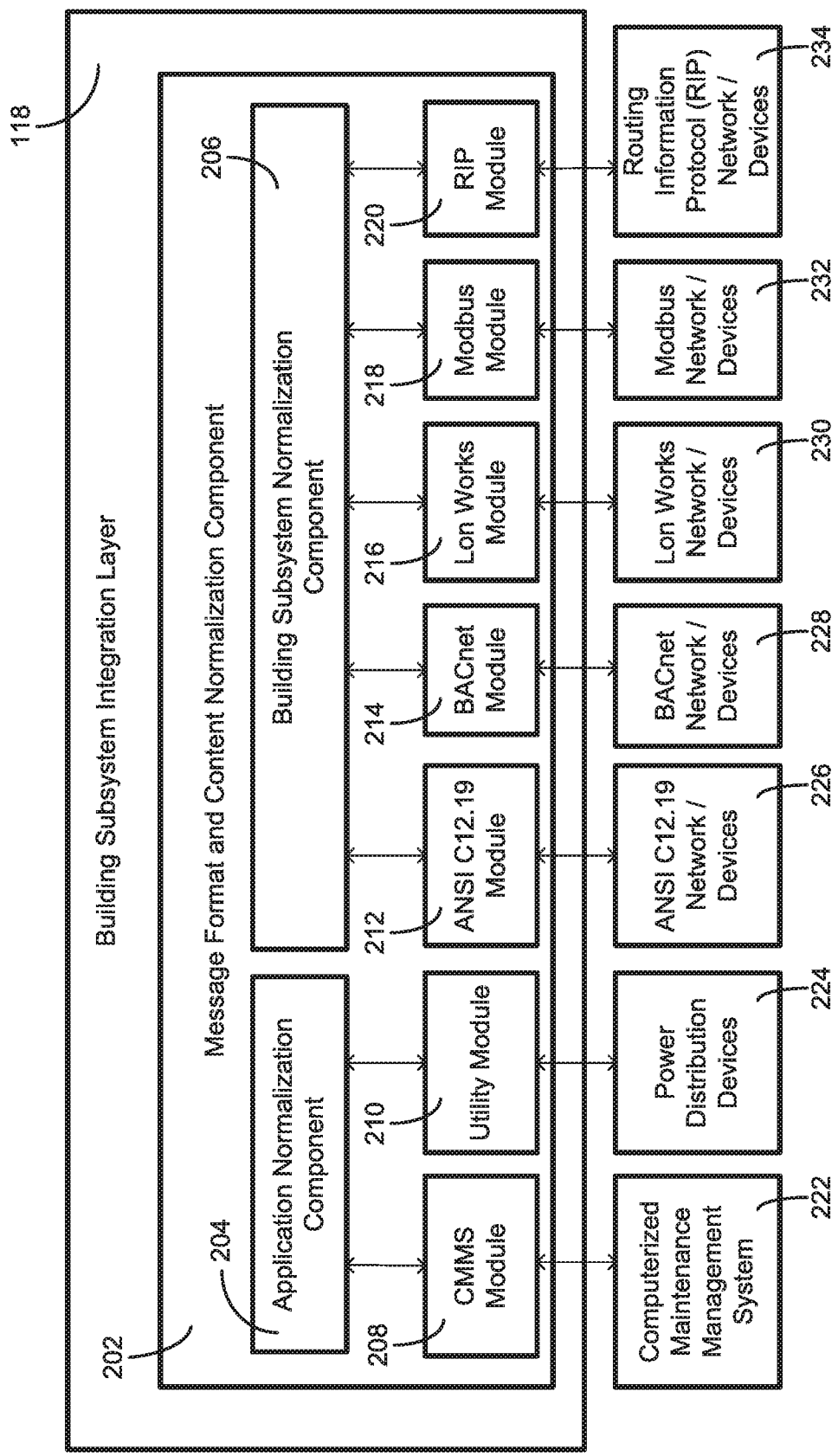
FIG. 2 is a block diagram of the building subsystem integration layer shown in FIG. 1A, according to an exemplary embodiment.

In FIG. 2, the building subsystem integration layer 118 is shown in greater detail to include a message format and content normalization component 202. The message format and content normalization component 202 is configured to convert data messages for and from disparately protocolled devices or networks (e.g., different building subsystems, differently protocolled smart-grid sources, etc.). The message format and content normalization component 202 is shown to include two subcomponents, an application normalization component 204 and a building subsystem normalization component 206. The application normalization component 204 is a computer function, object, service, or combination thereof configured to drive the conversion of communications for and from applications (e.g., enterprise level applications 120, 124 shown in FIG. 1A, a computerized maintenance management system 222, utility company applications via smart grid 104 shown in FIG. 1A, etc.). The building subsystem normalization component 206 is a computer function, object, service, or combination thereof configured to drive the conversion of communications for and from building subsystems (e.g., building subsystems 128 shown in FIG. 1A, building subsystem controllers, building devices, security systems, fire systems, etc.). The application normalization component 204 and the building subsystem normalization component 206 are configured to accommodate multiple communications or data protocols. In some embodiments, the application normalization component 204 and the building subsystem normalization component 206 are configured to conduct the conversion for each protocol based on information stored in modules 208-220 (e.g., a table, a script, in memory device 156 shown in FIG. 1B) for each of systems or devices 222-234. The protocol modules 208-220 may be, for example, schema maps or other descriptions of how a message for one protocol should be translated to a message for a second protocol. In some embodiments the modules 208-220 may be "plug-in" drivers that can be easily installed to or removed from a building subsystem integration layer 118 (e.g., via an executable installation routine, by placing a file in an interfaces folder, etc.) during setup. For example, modules 208-220 may be vendor specific (e.g., Johnson Controls, Honeywell, Siemens, etc.), standards-based (e.g., BACnet, ANSI C12.19, Lon Works, Modbus, RIP, SNMP, SOAP, web services, HTML, HTTP/HTTPS, XML, XAML, TFTP, DHCP, DNS, SMTP, SNTP, etc.), user built, user selected, and/or user customized. In some embodiments the application normalization component 204 or building subsystem normalization component 206 are configured for compatibility with new modules or drivers (e.g., user defined or provided by a vendor or third party). In such embodiments, message format and content normalization component 202 may advantageously be scaled for future applications or case-specific requirements (e.g., situations calling for the use of additional cyber security standards such as data encryption/decryption) by changing the active module set or by installing a new module.

Using message format and content normalization component 202, the building subsystem integration layer 118 can be configured to provide a service-oriented architecture for providing cross-subsystem control activities and cross-subsystem applications. The message format and content normalization component 202 can be configured to provide a relatively small number of straightforward interfaces (e.g., application programming interfaces (APIs)) or protocols (e.g., open protocols, unified protocols, common protocols) for use by layers 108-116 (shown in FIG. 1A) or external applications (e.g., 120, 124 shown in FIG. 1A) and to "hide" such layers or applications from the complexities of the underlying subsystems and their particular data transport protocols, data formats, semantics, interaction styles, and the like. Configuration of the message format and content normalization component 202 may occur automatically (e.g., via a building subsystem and device discovery process), via user configuration, or by a combination of automated discovery and user configuration. User configuration may be driven by providing one or more graphical user interfaces or "wizards" to a user, the graphical user interfaces allowing the user to map an attribute from one protocol to an attribute of another protocol. Configuration tool 162 shown in FIG. 1B may be configured to drive such an association process. The configuration tool 162 may be served to clients (local or remote) via web services 158 and/or GUI engine 160 (both shown in FIG. 1B). The configuration tool 162 may be provided as a thin web client (e.g., that primarily interfaces with web services 158) or a thick client (e.g., that only occasionally draws upon web services 158 and/or GUI engine 160). Configuration tool 162 may be configured to use a W3C standard intended to harmonize semantic information from different systems to controllably define, describe and store relationships between the data/protocols (e.g., define the modules 208-220). For example, the W3C standard used may be the Web Ontology Language (OWL). In some exemplary embodiments, configuration tool 162 may be configured to prepare the message format and content normalization component 202 (and device/protocol modules 208-220 thereof) for machine level interoperability of data content.

Once the building subsystem integration layer 118 is configured, developers of applications may be provided with a software development kit to allow rapid development of applications compatible with the smart building manager (e.g., with an application-facing protocol or API of the building subsystem integration layer). Such an API or application-facing protocol may be exposed at the enterprise integration layer 108 shown in FIGS. 1A and 1B. In various exemplary embodiments, the smart building manager 106 including building subsystem integration layer 118 includes the following features or advantages: seamless in that heterogeneous applications and subsystems may be integrated without varying or affecting the behavior of the external facing interfaces or logic; open in that it allows venders to develop products and applications by coding adapters (e.g. modules 208-220 shown in FIG. 2) or features according to a well-defined specification; multi-standard in that it supports subsystems that operate according to standards as well as proprietary protocols; extensible in that it accommodates new applications and subsystems with little to no modification; scalable in that it supports many applications and subsystems, adaptable in that it allows for the addition or deletion of applications or subsystems without affecting system consistency; user-configurable in that it is adjustable to changes in the business environment, business rules, or business workflows; and secure in that it protects information transferred through the integration channel. Additional details with respect to building subsystem integration layer 118 are described below with respect to FIG. 3.

Integrated Control Layer

Referring further to FIGS. 1A and 1B, the integrated control layer 116 is configured to use the data input and/or output of the building subsystem integration layer 118 to make control decisions. Due to the subsystem integration provided by the building subsystem integration layer 118, the integrated control layer 116 can integrate control activities of the subsystems 128 such that the subsystems 128 behave as a single integrated supersystem. In an exemplary embodiment the integrated control layer 116 includes control logic that uses inputs and outputs from a plurality of building subsystems to provide greater comfort and energy savings relative to the comfort and energy savings that separate subsystems could provide alone. For example, information from a first building subsystem may be used to control a second building subsystem. By way of a more particular example, when a building employee badges in at a parking garage, a message may be sent from the parking subsystem to the building subsystem integration layer 118, converted into an event recognized as a universal occupancy (e.g., "badge-in") event and provided to integrated control layer 116. Integrated control layer 116 may include logic that turns on the lights in the building employee's office, begins cooling the building employee's office in response to the anticipated occupancy, and boots up the employee's computer. The decision to turn the devices on is made by integrated control layer 116 and integrated control layer 116 may cause proper "on" commands to be forwarded to the particular subsystems (e.g., the lighting subsystem, the IT subsystem, the HVAC subsystem). The integrated control layer 116 passes the "on" commands through building subsystem integration layer 118 so that the messages are properly formatted or protocolled for receipt and action by the subsystems. As is illustrated in FIGS. 1A-B, the integrated control layer 116 is logically above the building subsystems and building subsystem controllers. The integrated control layer 116, by having access to information from multiple systems, is configured to use inputs from one or more building subsystems 128 to make control decisions for control algorithms of other building subsystems. For example, the "badge-in" event described above can be used by the integrated control layer 116 (e.g., a control algorithm thereof) to provide new setpoints to an HVAC control algorithm of the HVAC subsystem.

While conventional building subsystem controllers are only able to process inputs that are directly relevant to the performance of their own control loops, the integrated control layer 116 is configured to use an input from a first subsystem to make an energy-saving control decision for a second subsystem. Results of these decisions can be communicated back to the building subsystem integration layer 116 via, for example, the message format and content normalization component 202 shown in FIG. 2. Therefore, advantageously, regardless of the particular HVAC system or systems connected to the smart building manager, and due to the normalization at the building subsystem integration layer 118, the integrated control layer's control algorithms can determine a control strategy using normalized temperature inputs, and provide an output including a normalized setpoint temperature to the building subsystem integration layer. The building subsystem integration layer 118 can translate the normalized setpoint temperature into a command specific to the building subsystem or controller for which the setpoint adjustment is intended. If multiple subsystems are utilized to complete the same function (e.g., if multiple disparately protocolled HVAC subsystems are provided in different regions of a building), the building subsystem integration layer 118 can convert a command decision (e.g., to lower the temperature setpoint by 2 degrees) to multiple different commands for receipt and action by the multiple disparately protocolled HVAC subsystems. In this way, functions of the integrated control layer 116 may be executed using the capabilities of building subsystem integration layer 118. In an exemplary embodiment, the integrated control layer is configured to conduct the primary monitoring of system and subsystem statuses and interrelationships for the building. Such monitoring can cross the major energy consuming subsystems of a building to allow for cross-subsystem energy savings to be achieved (e.g., by the demand response layer 112).

The integrated control layer 116 is shown to be logically below the demand response layer 112. The integrated control layer 116 is configured to enhance the effectiveness of the demand response layer 112 by enabling building subsystems 128 and their respective control loops to be controlled in coordination with the demand response layer 112. This configuration may advantageously provide much less disruptive demand response behavior than conventional systems. For example, the integrated control layer 116 may be configured to assure that a demand response-driven upward adjustment to the setpoint for chilled water temperature (or another component that directly or indirectly affects temperature) does not result in an increase in fan energy (or other energy used to cool a space) that would result in greater total building energy use than was saved at the chiller. The integrated control layer 116 may also be configured to provide feedback to the demand response layer 112 so that the demand response layer 112 may check that constraints (e.g., temperature, lighting levels, etc.) are properly maintained even while demanded load shedding is in progress. The constraints may also include setpoint or sensed boundaries relating to safety, equipment operating limits and performance, comfort, fire codes, electrical codes, energy codes, and the like. The integrated control layer 116 is also logically below the fault detection and diagnostics layer 114 and the automated measurement and validation layer 110. The integrated control layer may be configured to provide calculated inputs (e.g., aggregations) to these "higher levels" based on outputs from more than one building subsystem.

Control activities that may be completed by the integrated control layer 116 (e.g., software modules or control algorithms thereof) include occupancy-based control activities. Security systems such as radio frequency location systems (RFLS), access control systems, and video surveillance systems can provide detailed occupancy information to the integrated control layer 116 and other building subsystems 128 via the smart building manager 106 (and more particularly, via the building subsystem integration layer 118). Integration of an access control subsystem and a security subsystem for a building may provide detailed occupancy data for consumption by the integrated control layer 116 (e.g., beyond binary "occupied" or "unoccupied" data available to some conventional HVAC systems that rely on, for example, a motion sensor). For example, the exact number of occupants in the building (or building zone, floor, conference room, etc.) may be provided to the integrated control layer 116 or aggregated by the integrated control layer 116 using inputs from a plurality of subsystems. The exact number of occupants in the building can be used by the integrated control layer 116 to determine and command appropriate adjustments for building subsystems 128 (such as HVAC subsystem 140 or lighting subsystem 142). Integrated control layer 116 may be configured to use the number of occupants, for example, to determine how many of the available elevators to activate in a building. If the building is only 20% occupied, the integrated control layer 116, for example, may be configured to power down 80% of the available elevators for energy savings. Further, occupancy data may be associated with individual workspaces (e.g., cubicles, offices, desks, workstations, etc.) and if a workspace is determined to be unoccupied by the integrated control layer, a control algorithm of the integrated control layer 116 may allow for the energy using devices serving the workspace to be turned off or commanded to enter a low power mode. For example, workspace plug-loads, task lighting, computers, and even phone circuits may be affected based on a determination by the integrated control layer that the employee associated with the workspace is on vacation (e.g., using data inputs received from a human-resources subsystem). Significant electrical loads may be shed by the integrated control layer 116, including, for example, heating and humidification loads, cooling and dehumidification loads, ventilation and fan loads, electric lighting and plug loads (e.g. with secondary thermal loads), electric elevator loads, and the like. The integrated control layer 116 may further be configured to integrate an HVAC subsystem or a lighting subsystem with sunlight shading devices or other "smart window" technologies. Natural day-lighting can significantly offset lighting loads but for optimal comfort may be controlled by the integrated control layer to prevent glare or over-lighting. Conversely, shading devices and smart windows may also be controlled by the integrated control layer 116 to calculably reduce solar heat gains in a building space—which can have a significant impact on cooling loads. Using feedback from sensors in the space, and with knowledge of the HVAC control strategy, the integrated control layer 116 may further be configured to control the transmission of infrared radiation into the building, minimizing thermal transmission when the HVAC subsystem is cooling and maximizing thermal transmission when the HVAC subsystem is heating. As a further example of an occupancy-based control strategy that may be implemented by the integrated control layer 116, inputs from a video security subsystem may be analyzed by a control algorithm of the integrated control layer 116 to make a determination regarding occupancy of a building space. Using the determination, the control algorithm may turn off the lights, adjust HVAC set points, power-down ICT devices serving the space, reduce ventilation, and the like—enabling energy savings with an acceptable loss of comfort to occupants of the building space.

Figure 3:
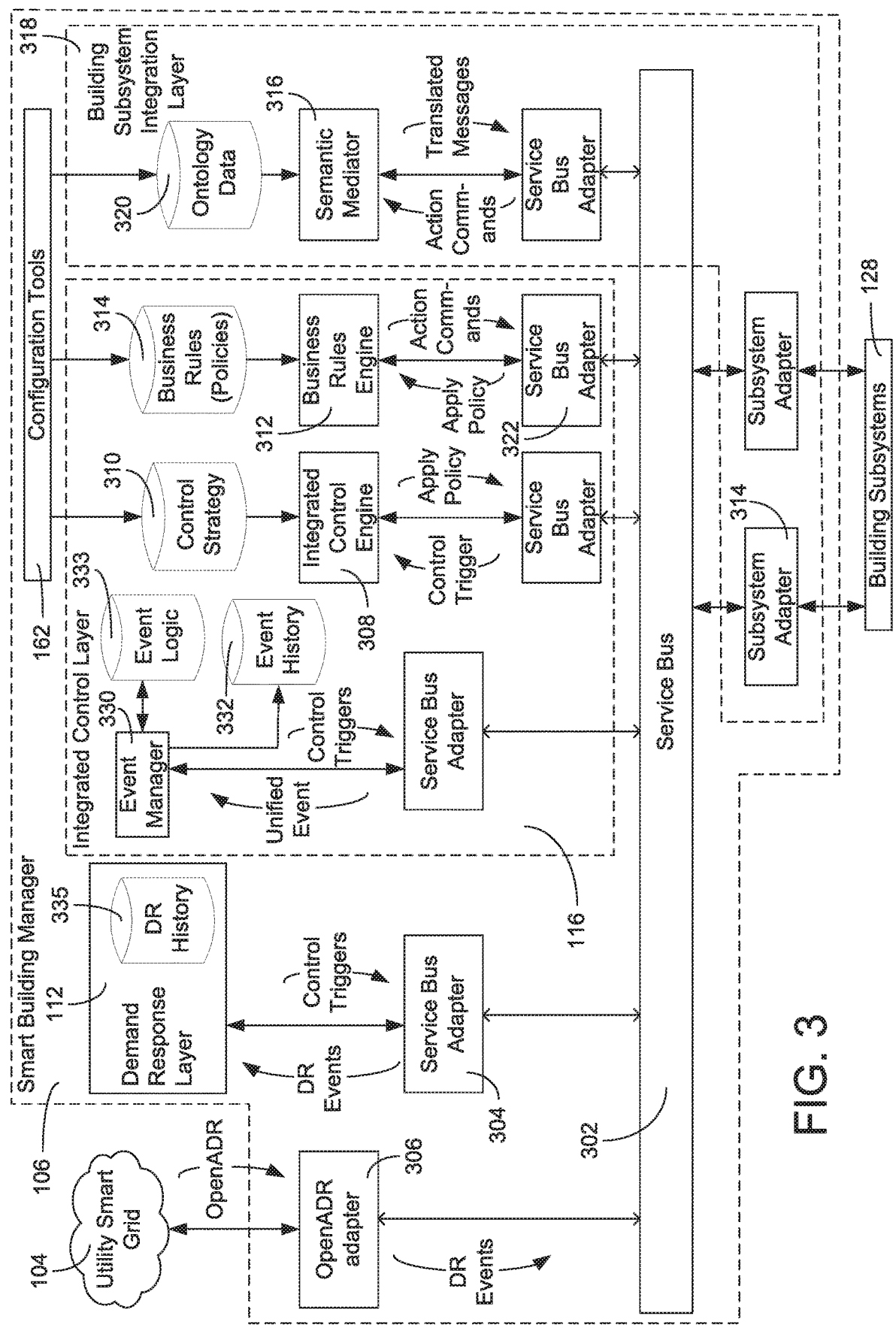
FIG. 3 is a detailed diagram of a portion of a smart building manager as shown in FIGS. 1A and 1B, according to an exemplary embodiment.

Referring now to FIG. 3, a detailed diagram of a portion of smart building manager 106 is shown, according to an exemplary embodiment. In particular, FIG. 3 illustrates a detailed embodiment of integrated control layer 116. Configuration tools 162 can allow a user to define (e.g., via graphical user interfaces, via prompt-driven "wizards", etc.) how the integrated control layer 116 should react to changing conditions in the building subsystems 128. In an exemplary embodiment configuration tools 162 allow a user to build and store condition-response scenarios that can cross multiple building subsystems and multiple enterprise control applications (e.g., work order management system applications, entity resource planning (ERP) applications, etc.).

Building subsystems 128, external sources such as smart grid 104, and internal layers such as demand response layer 112 can regularly generate events (e.g., messages, alarms, changed values, etc.) and provide the events to integrated control layer 116 or another layer configured to handle the particular event. For example, demand response (DR) events (e.g., a change in real time energy pricing) may be provided to smart building manager 106 as Open Automated Demand Response ("OpenADR") messages (a protocol developed by Lawrence Berkeley National Laboratories). The DR messages may be received by OpenADR adapter 306 (which may be a part of enterprise application layer 108 shown in FIGS. 1A and 1B). The OpenADR adapter 306 may be configured to convert the OpenADR message into a DR event configured to be understood (e.g., parsed, interpreted, processed, etc.) by demand response layer 112. The DR event may be formatted and transmitted according to or via a service bus 302 for the smart building manager 106.

Service bus adapter 304 may be configured to "trap" or otherwise receive the DR event on the service bus 302 and forward the DR event on to demand response layer 112. Service bus adapter 304 may be configured to queue, mediate, or otherwise manage demand response messages for demand response layer 112. Once a DR event is received by demand response layer 112, logic thereof can generate a control trigger in response to processing the DR event. The integrated control engine 308 of integrated control layer 116 is configured to parse the received control trigger to determine if a control strategy exists in control strategy database 310 that corresponds to the received control trigger. If a control strategy exists, integrated control engine 308 executes the stored control strategy for the control trigger. In some cases the output of the integrated control engine 308 will be an "apply policy" message for business rules engine 312 to process. Business rules engine 312 may process an "apply policy" message by looking up the policy in business rules database 314. A policy in business rules database 314 may take the form of a set of action commands for sending to building subsystems 128. The set of action commands may include ordering or scripting for conducting the action commands at the correct timing, ordering, or with other particular parameters. When business rules engine 312 processes the set of action commands, therefore, it can control the ordering, scripting, and other parameters of action commands transmitted to the building subsystems 128.

Action commands may be commands for relatively direct consumption by building subsystems 128, commands for other applications to process, or relatively abstract cross-subsystem commands. Commands for relatively direct consumption by building subsystems 128 can be passed through service bus adapter 322 to service bus 302 and to a subsystem adapter 314 for providing to a building subsystem in a format particular to the building subsystem. Commands for other applications to process may include commands for a user interface application to request feedback from a user, a command to generate a work order via a computerized maintenance management system (CMMS) application, a command to generate a change in an ERP application, or other application level commands.

More abstract cross-subsystem commands may be passed to a semantic mediator 316 which performs the task of translating those actions to the specific commands required by the various building subsystems 128. For example, a policy might contain an abstract action to "set lighting zone X to maximum light." The semantic mediator 316 may translate this action to a first command such as "set level to 100% for lighting object O in controller C" and a second command of "set lights to on in controller Z, zone_id_no 3141593." In this example both lighting object O in controller C and zone_id_no 3141593 in controller Z may affect lighting in zone X. Controller C may be a dimming controller for accent lighting while controller Z may be a non-dimming controller for the primary lighting in the room. The semantic mediator 316 is configured to determine the controllers that relate to zone X using ontology database 320. Ontology database 320 stores a representation or representations of relationships (the ontology) between building spaces and subsystem elements and subsystems elements and concepts of the integrated building supersystem. Using the ontology stored in ontology database 320, the semantic mediator can also determine that controller C is dimming and requires a numerical percentage parameter while controller Z is not dimming and requires only an on or off command. Configuration tool 162 can allow a user to build the ontology of ontology database 320 by establishing relationships between subsystems, building spaces, input/output points, or other concepts/objects of the building subsystems and the building space.

Events other than those received via OpenADR adapter 306, demand response layer 112, or any other specific event-handing mechanism can be trapped by subsystem adapter 314 (a part of building integration subsystem layer 318) and provided to a general event manager 330 via service bus 302 and a service bus adapter. By the time an event from a building subsystem 128 is received by event manager 330, it may have been converted into a unified event (i.e., "common event," "standardized event", etc.) by subsystem adapter 314 and/or other components of building subsystem integration layer 318 such as semantic mediator 316. The event manager 330 can utilize an event logic DB to lookup control triggers, control trigger scripts, or control trigger sequences based on received unified events. Event manager 330 can provide control triggers to integrated control engine 308 as described above with respect to demand response layer 112. As events are received they may be archived in event history 332 by event manager 330. Similarly, demand response layer 112 can store DR events in DR history 335. One or both of event manager 330 and demand response layer 112 may be configured to wait until multi-event conditions are met (e.g., by processing data in history as new events are received). For example, demand response layer 112 may include logic that does not act to reduce energy loads until a series of two sequential energy price increases are received. In an exemplary embodiment event manager 330 may be configured to receive time events (e.g., from a calendaring system). Different time events can be associated with different triggers in event logic database 333.

In an exemplary embodiment the configuration tools 162 can be used to build event conditions or trigger conditions in event logic 333 or control strategy database 310. For example, the configuration tools 162 can provide the user with the ability to combine data (e.g., from subsystems, from event histories) using a variety of conditional logic. In varying exemplary embodiments the conditional logic can range from simple logical operators between conditions (e.g., AND, OR, XOR, etc.) to pseudo-code constructs or complex programming language functions (allowing for more complex interactions, conditional statements, loops, etc.). The configuration tools 162 can present user interfaces for building such conditional logic. The user interfaces may allow users to define policies and responses graphically. In some embodiments the user interfaces may allow a user to select a pre-stored or pre-constructed policy and adapt it or enable it for use with their system.

Referring still to FIG. 3, in some embodiments integrated control layer 116 generally and integrated control engine 308 can operate as a "service" that can be used by higher level layers of smart building manager 106, enterprise applications, or subsystem logic whenever a policy or sequence of actions based on the occurrence of a condition is to be performed. In such embodiments control operations do not need to be reprogrammed—applications or logic can rely on the integrated control layer 116 to receive an event and to execute the related subsystem functions. For example, demand response layer 112, fault detection and diagnostics layer 114 (shown in FIGS. 1A and 1B), enterprise integration 108, and applications 120, 124 may all utilize a shared control strategy 310 and integrated control engine 308 in initiate response sequences to events.

Fault Detection and Diagnostics Layer

Figure 4:
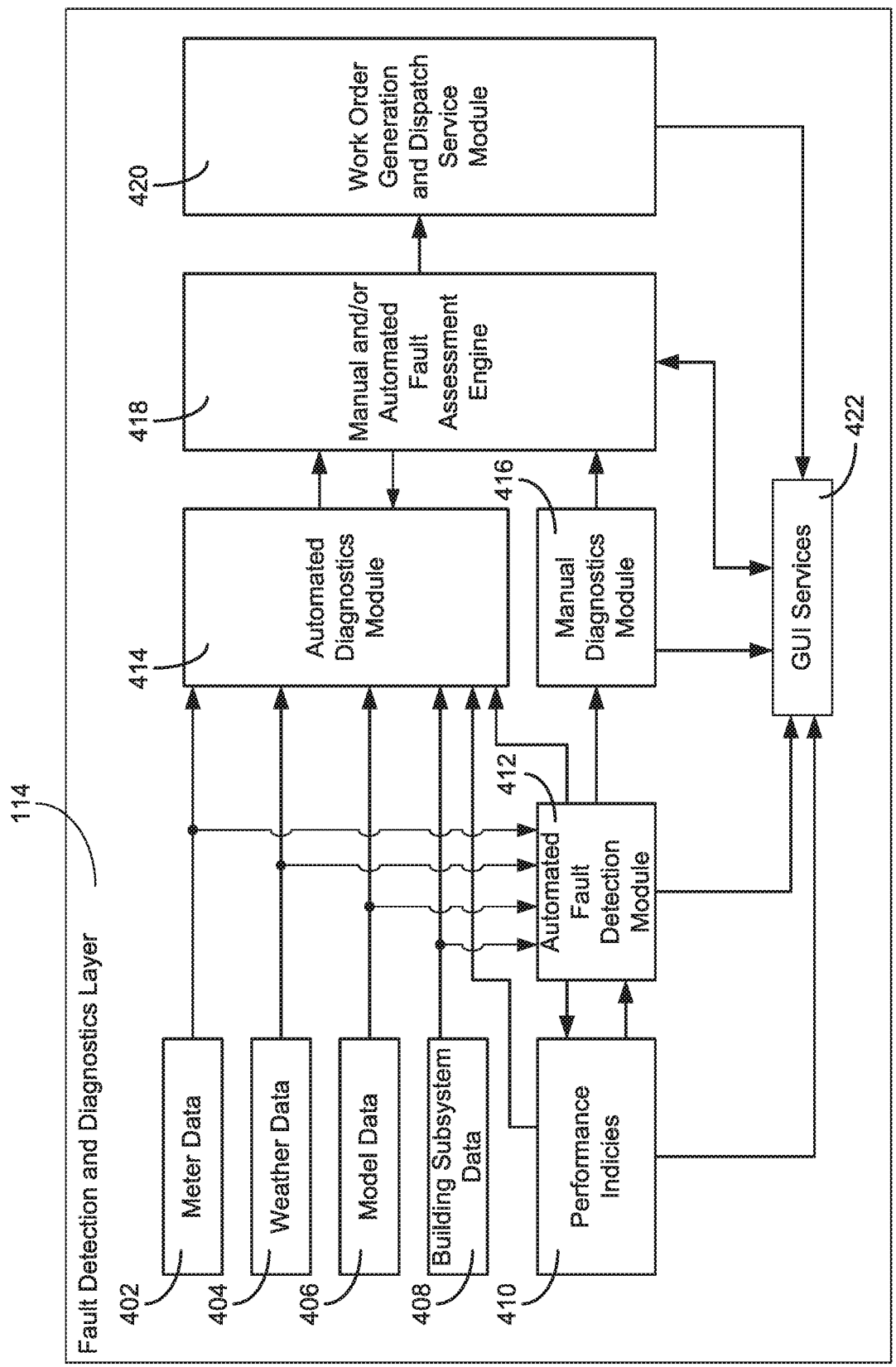
FIG. 4 is a detailed diagram of a fault detection and diagnostics layer as shown in FIGS. 1A and 1B, according to an exemplary embodiment.

Referring now to FIG. 4, the fault detection and diagnostics (FDD) layer 114 is shown in greater detail, according to an exemplary embodiment. Fault detection and diagnostics (FDD) layer 114 is configured to provide on-going fault detection of building subsystems, building subsystem devices, and control algorithms of the integrated control layer. The FDD layer 114 may receive its inputs from the integrated control layer, directly from one or more building subsystems or devices, or from the smart grid. The FDD layer 114 may automatically diagnose and respond to detected faults. The responses to detected or diagnosed faults may include providing an alert message to a user, a maintenance scheduling system, or a control algorithm configured to attempt to repair the fault or to work-around the fault. In other exemplary embodiments FDD layer 114 is configured to provide "fault" events to integrated control layer as described with reference to FIG. 3 and the integrated control layer of FIG. 3 is configured to execute control strategies and policies in response to the received fault events. According to an exemplary embodiment, the FDD layer 114 (or a policy executed by an integrated control engine or business rules engine) may shut-down systems or direct control activities around faulty devices or systems to reduce energy waste, extend equipment life, or assure proper control response. The FDD layer 114 may be configured to use statistical analysis of near real-time and/or historical building subsystem data to rapidly identify faults in equipment operation.

As shown in FIG. 4, the FDD layer 114 is configured to store or access a variety of different system data stores (or data points for live data) 402-410. FDD layer 114 may use some content of data stores 402-410 to identify faults at the equipment level (e.g., specific chiller, specific AHU, specific terminal unit, etc.) and other content to identify faults at component or subsystem levels. The FDD layer 114 may be configured to output a specific identification of the faulty component or cause of the fault (e.g., loose damper linkage) using detailed subsystem inputs available at the building subsystem integration layer (shown in previous Figures). Such specificity and determinations may be calculated by the FDD layer 114 based on such subsystem inputs and, for example, statistical fault detection module 412. Statistical fault detection module 412 can utilize pattern recognition methods, pattern classification methods, rule-based classification methods, outlier analysis, statistical quality control charting techniques, or the like to conduct its statistical analysis. In some embodiments statistical fault detection module 412 more particularly is configured to calculate or update performance indices 410. Performance indices 410 may be calculated based on exponentially-weighted moving averages (EWMAs) to provide statistical analysis features which allow outlier and statistical process control (SPC) techniques to be used to identify faults. For example, the FDD layer 114 may be configured to use meter data 402 outliers to detect when energy consumption becomes abnormal. Statistical fault detection module 412 may also or alternatively be configured to analyze the meter data 402 using statistical methods that provide for data clustering, outlier analysis, and/or quality control determinations. The meter data 402 may be received from, for example, a smart meter, a utility, or calculated based on the building-use data available to the smart building manager.

Once a fault is detected by the FDD layer 114 (e.g., by statistical fault detection module 412), the FDD layer 114 may be configured to generate one or more alarms or events to prompt manual fault diagnostics or to initiate an automatic fault diagnostics activity via automated diagnostics module 414. Automatic fault diagnostics module 414 may be configured to use meter data 402, weather data 404, model data 406 (e.g., performance models based on historical building equipment performance), building subsystem data 408, performance indices 410, or other data available at the building subsystem integration layer to complete its fault diagnostics activities.

In an exemplary embodiment, when a fault is detected, the automated diagnostics module 414 is configured to investigate the fault by initiating expanded data logging and error detection/diagnostics activities relative to the inputs, outputs, and systems related to the fault. For example, the automated diagnostics module 414 may be configured to poll sensors associated with an air handling unit (AHU) (e.g., temperature sensors for the space served by the AHU, air flow sensors, position sensors, etc.) on a frequent or more synchronized basis to better diagnose the source of a detected AHU fault.

Automated fault diagnostics module 414 may further be configured to compute residuals (differences between measured and expected values) for analysis to determine the fault source. For example, automated fault diagnostics module 414 may be configured to implement processing circuits or methods described in U.S. patent application Ser. No. 12/487,594, filed Jun. 18, 2009, titled "Systems and Methods for Fault Detection of Air Handling Units," the entirety of which is incorporated herein by reference. Automated fault diagnostics module 414 can use a finite state machine and input from system sensors (e.g., temperature sensors, air mass sensors, etc.) to diagnose faults. State transition frequency (e.g., between a heating state, a free cooling state, and a mechanical cooling state) may also be used by the statistical fault detection module 412 and/or the automated diagnostics module 414 to identify and diagnose unstable control issues. The FDD layer 114 may also or alternatively be configured for rule-based predictive detection and diagnostics (e.g., to determine rule thresholds, to provide for continuous monitoring and diagnostics of building equipment).

In addition to or as an alternative to an automated diagnostics process provided by automated diagnostics module 414, FDD layer 114 can drive a user through a manual diagnostic process using manual diagnostics module 416. One or both of automated diagnostics module 414 and manual diagnostics module 416 can store data regarding the fault and the diagnosis thereof for further assessment by manual and/or automated fault assessment engine 418. Any manually driven process of assessment engine 418 can utilize graphical or textual user interfaces displayed to a user to receive feedback or input from a user. In some embodiments assessment engine 418 will provide a number of possible reasons for a fault to the user via a GUI. The user may select one of the faults for manual investigation or calculation. Similarly, an automated process of assessment engine 418 may be configured to select the most probable cause for a fault based on diagnostics provided by modules 414 or 416. Once a cause is detected or estimated using assessment engine 418, a work order can be generated by work order generation and dispatch service 420. Work order generation and dispatch service can transmit the work order to a service management system and/or a work dispatch service 420 for action.

Further, data and processing results from modules 412, 414, 416, 418 or other data stored or modules of a fault detection and diagnostics layer can be provided to the enterprise integration layer shown in FIGS. 1A and 1B. Monitoring and reporting applications 120 can then access the data or be pushed the data so that real time "system health" dashboards can be viewed and navigated by a user (e.g., a building engineer). For example, monitoring and reporting applications 120 may include a web-based monitoring application that includes several graphical user interface (GUI) elements (e.g., widgets, dashboard controls, windows, etc.) for displaying key performance indicators (KPI) or other information to users of a GUI using FDD layer 114 information or analyses. In addition, the GUI elements may summarize relative energy use and intensity across different buildings (real or modeled), different campuses, or the like. Other GUI elements or reports may be generated and shown based on available data that allow facility managers to assess performance across a group of buildings from one screen. The user interface or report (or underlying data engine) may be configured to aggregate and categorize faults by building, building type, equipment type, fault type, times of occurrence, frequency of occurrence, severity, and the like. The GUI elements may include charts or histograms that allow the user to visually analyze the magnitude of occurrence of specific faults or equipment for a building, time frame, or other grouping. A "time series" pane of the GUI may allow users to diagnose a fault remotely by analyzing and comparing interval time-series data, trends, and patterns for various input/output points tracked/logged by the FDD layer 114. The FDD layer 114 may include one or more GUI servers or services 422 (e.g., a web service) to support such applications. Further, in some embodiments applications and GUI engines may be included outside of the FDD layer 114 (e.g., monitoring and reporting applications 120 shown in FIG. 1A, web services 158 shown in FIG. 1B, GUI engine 160 shown in FIG. 1B). The FDD layer 114 may be configured to maintain detailed historical databases (e.g., relational databases, XML databases, etc.) of relevant data and includes computer code modules that continuously, frequently, or infrequently query, aggregate, transform, search, or otherwise process the data maintained in the detailed databases. The FDD layer 114 may be configured to provide the results of any such processing to other databases, tables, XML files, or other data structures for further querying, calculation, or access by, for example, external monitoring and reporting applications.

In an exemplary embodiment the automated diagnostics module 414 automatically prioritizes detected faults. The prioritization may be conducted based on customer-defined criteria. The prioritization may be used by the manual or automated fault assessment module 418 to determine which faults to communicate to a human user via a dashboard or other GUI. Further, the prioritization can be used by the work order dispatch service to determine which faults are worthy of immediate investigation or which faults should be investigated during regular servicing rather than a special work request. The FDD layer 114 may be configured to determine the prioritization based on the expected financial impact of the fault. The fault assessment module 418 may retrieve fault information and compare the fault information to historical information. Using the comparison, the fault assessment module 418 may determine an increased energy consumption and use pricing information from the smart grid to calculate the cost over time (e.g., cost per day). Each fault in the system may be ranked according to cost or lost energy. The fault assessment module 418 may be configured to generate a report for supporting operational decisions and capital requests. The report may include the cost of allowing faults to persist, energy wasted due to the fault, potential cost to fix the fault (e.g., based on a service schedule), or other overall metrics such as overall subsystem or building reliability (e.g., compared to a benchmark). The fault assessment module 418 may further be configured to conduct equipment hierarchy-based suppression of faults (e.g., suppressed relative to a user interface, suppressed relative to further diagnostics, etc.). For such suppression, module 418 may use the hierarchical information available at, e.g., integrated control layer 116 or building subsystem integration layer 318 shown in FIG. 3. For example, module 418 may utilize building subsystem hierarchy information stored in ontology database 320 to suppress lower level faults in favor of a higher level fault (suppress faults for a particular temperature sensor and air handling unit in favor of a fault that communicates "Inspect HVAC Components Serving Conference Room 30").

FDD layer 114 may also receive inputs from lower level FDD processes. For example, FDD layer 114 may receive inputs from building subsystem supervisory controllers or field controllers having FDD features. In an exemplary embodiment FDD layer 114 may receive "FDD events," process the received FDD events, query the building subsystems for further information, or otherwise use the FDD events in an overall FDD scheme (e.g., prioritization and reporting). U.S. Pat. No. 6,223,544 (titled "INTEGRATED CONTROL AND FAULT DETECTION OF HVAC EQUIPMENT," issued May 1, 2001)(incorporated herein by reference) and U.S. Pub. No. 2009/0083583 (titled "FAULT DETECTION SYSTEMS AND METHODS FOR SELF-OPTIMIZING HEATING, VENTILATION, AND AIR CONDITIONING CONTROLS", filed Nov. 25, 2008, published Mar. 26, 2009)(incorporated herein by reference) may be referred to as examples of FDD systems and methods that may be implemented by FDD layer 114 (and/or lower level FDD processes for providing information to FDD layer 114).

Demand Response Layer

FIGS. 1A and 1B are further shown to include a demand response (DR) layer 112. The DR layer 112 is configured to optimize electrical demand in response to time-of-use prices, curtailment signals, or energy availability. Data regarding time-of-use prices, energy availability, and curtailment signals may be received from the smart grid 104, from energy providers and purchasers 102 (e.g., an energy aggregator) via the smart grid 104, from energy providers and purchasers 102 via a communication network apart from the smart grid, from distributed energy generation systems 122, from energy storage banks 126, or from other sources. According to an exemplary embodiment, the DR layer 112 includes control logic for responding to the data and signals it receives. These responses can include communicating with the control algorithms in the integrated control layer 116 to "load shed," changing control strategies, changing setpoints, or shutting down building devices or subsystems in a controlled manner. The architecture and process for supporting DR events is shown in and described with reference to FIG. 3. The DR layer 112 may also include control logic configured to determine when to utilize stored energy based on information from the smart grid and information from a local or remote energy storage system. For example, when the DR layer 112 receives a message indicating rising energy prices during a future "peak use" hour, the DR layer 112 can decide to begin using power from the energy storage system just prior to the beginning of the "peak use" hour.

In some exemplary embodiments the DR layer 112 may include a control module configured to actively initiate control actions (e.g., automatically changing setpoints) which minimize energy costs based on one or more inputs representative of or based on demand (e.g., price, a curtailment signal, a demand level, etc.). The DR layer 112 may further include or draw upon one or more DR policy definitions (e.g., databases, XML files, etc.). The policy definitions may be edited or adjusted by a user (e.g., via a graphical user interface) so that the control actions initiated in response to demand inputs may be tailored for the user's application, desired comfort level, particular building equipment, or based on other concerns. For example, the DR policy definitions can specify which equipment may be turned on or off in response to particular demand inputs, how long a system or piece of equipment should be turned off, what setpoints can be changed, what the allowable set point adjustment range is, how long to hold a "high demand" setpoint before returning to a normally scheduled setpoint, how close to approach capacity limits, which equipment modes to utilize, the energy transfer rates (e.g., the maximum rate, an alarm rate, other rate boundary information, etc.) into and out of energy storage devices (e.g., thermal storage tanks, battery banks, etc.), and when to dispatch on-site generation of energy (e.g., via fuel cells, a motor generator set, etc.). One or more of the policies and control activities may be located within control strategy database 310 or business rules database 314. Further, as described above with reference to FIG. 3, some of the DR responses to events may be processed and completed by integrated control layer 116 with or without further inputs or processing by DR layer 112.

A plurality of market-based DR inputs and reliability based DR inputs may be configured (e.g., via the DR policy definitions or other system configuration mechanisms) for use by the DR layer 112. The smart building manager 106 may be configured (e.g., self-configured, manually configured, configured via DR policy definitions, etc.) to select, deselect or differently weigh varying inputs in the DR layer's calculation or execution of control strategies based on the inputs. DR layer 112 may automatically (and/or via the user configuration) calculate outputs or control strategies based on a balance of minimizing energy cost and maximizing comfort. Such balance may be adjusted (e.g., graphically, via rule sliders, etc.) by users of the smart building manager via a configuration utility or administration GUI.

The DR layer 112 may be configured to receive inputs from other layers (e.g., the building subsystem integration layer, the integrated control layer, etc.). The inputs received from other layers may include environmental or sensor inputs such as temperature, carbon dioxide levels, relative humidity levels, air quality sensor outputs, occupancy sensor outputs, room schedules, and the like. The inputs may also include inputs such as electrical use (e.g., expressed in kWh), thermal load measurements, pricing information, projected pricing, smoothed pricing, curtailment signals from utilities, and the like from inside the system, from the smart grid 104, or from other remote sources.

Some embodiments of the DR layer 112 may utilize industry standard "open" protocols or emerging National Institute of Standards and Technology (NIST) standards to receive real-time pricing (RTP) or curtailment signals from utilities or power retailers. In other embodiments, proprietary protocols or other standards may be utilized. As mentioned above, in some exemplary embodiments, the DR layer 112 is configured to use the OpenADR protocol to receive curtailment signals or RTP data from utilities, other independent system operators (ISOs), or other smart grid sources. The DR layer 112, or another layer (e.g., the enterprise integration layer) that serves the DR layer 112 may be configured to use one or more security schemes or standards such as the Organization for the Advancement of Structured Information Standards (OASIS) Web Service Security Standards to provide for secure communications to/from the DR layer 112 and the smart grid 104 (e.g., a utility company's data communications network). If the utility does not use a standard protocol (e.g., the OpenADR protocol), the DR layer 112, the enterprise integration layer 108, or the building subsystem integration layer 118 may be configured to translate the utility's protocol into a format for use by the utility. The DR layer 112 may be configured to bi-directionally communicate with the smart grid 104 or energy providers and purchasers 102 (e.g., a utility, an energy retailer, a group of utilities, an energy broker, etc.) to exchange price information, demand information, curtailable load calculations (e.g., the amount of load calculated by the DR layer to be able to be shed without exceeding parameters defined by the system or user), load profile forecasts, and the like. DR layer 112 or an enterprise application 120, 124 in communication with the DR layer 112 may be configured to continuously monitor pricing data provided by utilities/ISOs across the nation, to parse the useful information from the monitored data, and to display the useful information to a user to or send the information to other systems or layers (e.g., integrated control layer 116).

The DR layer 112 may be configured to include one or more adjustable control algorithms in addition to or as an alternative from allowing the user creation of DR profiles. For example, one or more control algorithms may be automatically adjusted by the DR layer 112 using dynamic programming or model predictive control modules. In one embodiment business rules engine 312 is configured to respond to a DR event by adjusting a control algorithm or selecting a different control algorithm to use (e.g., for a lighting system, for an HVAC system, for a combination of multiple building subsystems, etc.).

The smart building manager 106 (e.g., using the demand response layer 112) can be configured to automatically (or with the help of a user) manage energy spend. The smart building manager 106 (with input from the user or operating using pre-configured business rules shown in FIG. 3) may be configured to accept time-of-use pricing signals or information from a smart grid (e.g., an energy provider, a smart meter, etc.) and, using its knowledge of historical building system data, control algorithms, calendar information, and/or weather information received from a remote source, may be configured to conduct automatic cost forecasting. The smart building manager 106 (e.g., the demand response layer 112) may automatically (or with user approval) take specific load shedding actions or control algorithm changes in response to different cost forecasts.

The smart building manager 106 may also be configured to monitor and control energy storage systems 126 (e.g., thermal, electrical, etc.) and distributed generation systems 122 (e.g., a solar array for the building, etc.). The smart building manager 106 or DR layer 112 may also be configured to model utility rates to make decisions for the system. All of the aforementioned processing activities or inputs may be used by the smart building manager 106 (and more particularly, a demand response layer 112 thereof) to limit, cap, profit-from, or otherwise manage the building or campus's energy spend. For example, using time-of-use pricing information for an upcoming hour that indicates an unusually high price per kilowatt hour, the system may use its control of a plurality of building systems to limit cost without too drastically impacting occupant comfort. To make such a decision and to conduct such activity, the smart building manager 106 may use data such as a relatively high load forecast for a building and information that energy storage levels or distributed energy levels are low. The smart building manager 106 may accordingly adjust or select a control strategy to reduce ventilation levels provided to unoccupied areas, reduce server load, raise a cooling setpoint throughout the building, reserve stored power for use during the expensive period of time, dim lights in occupied areas, turn off lights in unoccupied areas, and the like.

The smart building manager 106 may provide yet other services to improve building or grid performance. For example, the smart building manager 106 may provide for expanded user-driven load control (allowing a building manager to shed loads at a high level of system/device granularity). The smart building manager 106 may also monitor and control power switching equipment to route power to/from the most efficient sources or destinations. The smart building manager 106 may communicate to the power switching equipment within the building or campus to conduct "smart" voltage regulation. For example, in the event of a brownout, the smart building manager 106 may prioritize branches of a building's internal power grid—tightly regulating and ensuring voltage to high priority equipment (e.g., communications equipment, data center equipment, cooling equipment for a clean room or chemical factory, etc.) while allowing voltage to lower priority equipment to dip or be cut off by the smart grid (e.g., the power provider). The smart building manager 106 or the DR layer 112 may plan these activities or proactively begin load shedding based on grid services capacity forecasting conducted by a source on the smart grid or by a local algorithm (e.g., an algorithm of the demand response layer). The smart building manager 106 or the DR layer 112 may further include control logic for purchasing energy, selling energy, or otherwise participating in a real-time or near real-time energy market or auction. For example, if energy is predicted to be expensive during a time when the DR layer 112 determines it can shed extra load or perhaps even enter a net-positive energy state using energy generated by solar arrays, or other energy sources of the building or campus, the DR layer 112 may offer units of energy during that period for sale back to the smart grid (e.g., directly to the utility, to another purchaser, in exchange for carbon credits, etc.).

In some exemplary embodiments, the DR layer 112 may also be configured to support a "Grid Aware" plug-in hybrid electric vehicle (PHEV)/electric vehicle charging system instead of (or in addition to) having the charging system in the vehicles be grid-aware. For example, in buildings that have vehicle charging stations (e.g., terminals in a parking lot for charging an electric or hybrid vehicle), the DR layer 112 can decide when to charge the vehicles (e.g., when to enable the charging stations, when to switch a relay providing power to the charging stations, etc.) based upon time, real time pricing (RTP) information from the smart grid, or other pricing, demand, or curtailment information from the smart grid. In other embodiments, each vehicle owner could set a policy that is communicated to the charging station and back to the DR layer 112 via wired or wireless communications that the DR layer 112 could be instructed to follow. The policy information could be provided to the DR layer 112 via an enterprise application 124, a vehicle information system, or a personal portal (e.g., a web site vehicle owner's are able to access to input, for example, at what price they would like to enable charging). The DR layer 112 could then activate the PHEV charging station based upon that policy unless a curtailment event is expected (or occurs) or unless the DR layer 112 otherwise determines that charging should not occur (e.g., decides that electrical storage should be conducted instead to help with upcoming anticipated peak demand). When such a decision is made, the DR layer 112 may pre-charge the vehicle or suspend charge to the vehicle (e.g., via a data command to the charging station). Vehicle charging may be restricted or turned off by the smart building manager during periods of high energy use or expensive energy. Further, during such periods, the smart building manager 106 or the DR layer 112 may be configured to cause energy to be drawn from plugged-in connected vehicles to supplement or to provide back-up power to grid energy.

Using the real time (or near real-time) detailed information regarding energy use in the building, the smart building manager 106 may maintain a greenhouse gas inventory, forecast renewable energy use, surpluses, deficits, and generation, and facilitate emission allocation, emission trading, and the like. Due to the detailed and real-time or near real-time nature of such calculations, the smart building manager 106 may include or be coupled to a micro-transaction emission trading platform.

The DR layer 112 may further be configured to facilitate the storage of on-site electrical or thermal storage and to controllably shift electrical loads from peak to off peak times using the stored electrical or thermal storage. The DR layer 112 may be configured to significantly shed loads during peak hours if, for example, high price or contracted curtailment signals are received, using the stored electrical or thermal storage and without significantly affecting building operation or comfort. The integrated control layer 116 may be configured to use a building pre-cooling algorithm in the night or morning and rely on calculated thermal storage characteristics for the building in order to reduce peak demand for cooling. Further, the integrated control layer 116 may be configured to use inputs such as utility rates, type of cooling equipment, occupancy schedule, building construction, climate conditions, upcoming weather events, and the like to make control decisions (e.g., the extent to which to pre-cool, etc.).

Automated Measurement & Verification Layer

FIGS. 1A and 1B are further shown to include an automated measurement and validation layer 110 configured to evaluate building system (and subsystem) performance. The automated measurement and validation (AM&V) layer 110 may implement various methods or standards of the international performance measurement and validation (IPMVP) protocol. In an exemplary embodiment, the AM&V layer 110 is configured to automatically (e.g., using data aggregated by the AM&V layer 110, integrated control layer 116, building subsystem integration layer 118, FDD layer 114, or otherwise) verify the impact of the integrated control layer 116, the FDD layer 114, the DR layer 112, or other energy-saving strategies of the smart building manager 106. For example, the AM&V layer 110 may be used to validate energy savings obtained by capital intensive retrofit projects that are monitored or managed post retrofit by the smart building manager. The AM&V layer 110 may be configured to calculate, for example, a return on investment date, the money saved using pricing information available from utilities, and the like. The AM&V layer 110 may allow for user selection of the validation method(s) it uses. For example, the AM&V layer 110 may allow for the user to select IPMVP Option C which specifies a method for the direct comparison of monthly or daily energy use from a baseline model to actual data from the post-installation measurement period. IPMVP Option C, for example, may specify for adjustments to be made of the base-year energy model analysis to account for current year over base year changes in energy-governing factors such as weather, metering period, occupancy, or production volumes. The AM&V layer 110 may be configured to track (e.g., using received communications) the inputs for use by such a validation method at regular intervals and may be configured to make adjustments to an "adjusted baseline energy use" model against which to measure savings. The AM&V layer 110 may further allow for manual or automatic non-routine adjustments of factors such as changes to the facility size, building envelope, or major equipment. Algorithms according to IPMVP Option B or Option A may also or alternatively be used or included with the AM&V layer 110. IPMVP Option B and IPMVP Option A involve measuring or calculating energy use of a system in isolation before and after it is retrofitted. Using the building subsystem integration layer (or other layers of the BMS), relevant data may be stored and the AM&V layer 110 may be configured to track the parameters specified by IPMVP Option B or A for the computation of energy savings for a system in isolation (e.g., flow rates, temperatures, power for a chiller, etc.).

The AM&V layer 110 may further be configured to verify that control strategies commanded by, for example, the integrated control layer or the DR layer are working properly. Further, the AM&V layer 110 may be configured to verify that a building has fulfilled curtailment contract obligations. The AM&V layer 110 may further be configured as an independent verification source for the energy supply company (utility). One concern of the utility is that a conventional smart meter may be compromised to report less energy (or energy consumed at the wrong time). The AM&V layer 110 can be used to audit smart meter data (or other data used by the utility) by measuring energy consumption directly from the building subsystems or knowledge of building subsystem usage and comparing the measurement or knowledge to the metered consumption data. If there is a discrepancy, the AM&V layer may be configured to report the discrepancy directly to the utility. Because the AM&V layer may be continuously operational and automated (e.g., not based on a monthly or quarterly calculation), the AM&V layer may be configured to provide verification of impact (e.g., of demand signals) on a granular scale (e.g., hourly, daily, weekly, etc.). For example, the AM&V layer may be configured to support the validation of very short curtailment contracts (e.g., drop X kW/h over 20 minutes starting at 2:00 pm) acted upon by the DR layer 112. The DR layer 112 may track meter data to create a subhourly baseline model against which to measure load reductions. The model may be based on average load during a period of hours prior to the curtailment event, during the five prior uncontrolled days, or as specified by other contract requirements from a utility or curtailment service provider (e.g., broker). The calculations made by the AM&V layer 110 may be based on building system energy models and may be driven by a combination of stipulated and measured input parameters to estimate, calculate, apportion, and/or plan for load reductions resulting from the DR control activities.

The AM&V layer 110 may yet further be configured to calculate energy savings and peak demand reductions in accordance with standards, protocols, or best practices for enterprise accounting and reporting on greenhouse gas (GHG) emissions. An application may access data provided or calculated by the AM&V layer 110 to provide for web-based graphical user interfaces or reports. The data underlying the GUIs or reports may be checked by the AM&V layer 110 according to, for example, the GHG Protocol Corporate Accounting Standard and the GHG Protocol for Project Accounting. The AM&V layer 110 preferably consolidates data from all the potential sources of GHG emissions at a building or campus and calculates carbon credits, energy savings in dollars (or any other currency or unit of measure), makes adjustments to the calculations or outputs based on any numbers of standards or methods, and creates detailed accountings or inventories of GHG emissions or emission reductions for each building. Such calculations and outputs may allow the AM&V layer 110 to communicate with electronic trading platforms, contract partners, or other third parties in real time or near real time to facilitate, for example, carbon offset trading and the like.

The AM&V Layer 110 may be further configured to become a "smart electric meter" a or substitute for conventional electric meters. One reason the adoption rate of the "Smart Electric Grid" has conventionally been low is that the entire stock of installed electric meters needs to be replaced so that the meters will support Real Time Pricing (RTP) of energy and other data communications features. The AM&V layer 110 can collect interval-based electric meter data and store the data within the system. The AM&V layer 110 can also communicate with the utility to retrieve or otherwise receive Real Time Pricing (RTP) signals or other pricing information and associate the prices with the meter data. The utility can query this information from the smart building manager (e.g., the AM&V layer 110, the DR layer 112) at the end of a billing period and charge the customer using a RTP tariff or another mechanism. In this manner, the AM&V layer 110 can be used as a "Smart Electric Meter".

When the AM&V layer 110 is used in conjunction with the DR layer 112, building subsystem integration layer 118, and enterprise integration layer 108, the smart building manager 106 can be configured as an energy service portal (ESP). As an ESP, the smart building manager 106 may communicably or functionally connect the smart grid (e.g., energy supply company, utility, ISO, broker, etc.) network to the metering and energy management devices in a building (e.g., devices built into appliances such as dishwashers or other "smart" appliances). In other words, the smart building manager 106 may be configured to route messages to and from other data-aware (e.g., Real Time Pricing (RTP) aware, curtailment signal aware, pricing aware, etc.) devices and the energy supply company. In this configuration, building subsystems that are not RTP aware will be managed by the DR layer 112 while devices that are RTP aware can get signals directly from the utility. For example, if a vehicle (e.g., PHEV) is programmed to charge only when the price of electricity is below $0.1/kWh, the PHEV can query the utility through the smart building manager and charge independently from the DR layer 112.

In an exemplary embodiment the AM&V layer described in U.S. Provisional Application No. 61/302,854, filed Feb. 9, 2010 can be used as AM&V layer 110 or a part thereof.

Enterprise Integration Layer

The enterprise integration layer 108 shown in FIG. 1A or FIG. 1B is configured to serve clients or local applications with information and services to support a variety of enterprise-level applications. The enterprise integration layer 108 may be configured to communicate (in real time or near real time) with the smart grid 104 and/or energy providers and purchasers 102. More particularly, in some embodiments the enterprise integration layer 108 may communicate with "smart meters," automated meter interfaces with utilities, carbon emission tracking and accounting systems, energy reporting systems, a building occupant interface, and traditional enterprise productivity applications (e.g., maintenance management systems, financial systems, workplace and supply chain management systems, etc.). The enterprise integration layer 108 may be configured to use protocols and methods as described above with respect to other layers or otherwise.

Building Occupant Interface

As indicated above, the enterprise integration layer 108 shown in FIG. 1B may be configured to exchange information with a building occupant interface application. In other exemplary embodiments the enterprise integration layer 108 serves the building occupant interface application to clients connecting to the enterprise integration layer 108, web services 158, and/or GUI engine 160. In yet other embodiments web services 158 may utilize GUI engine 160 for graphics rendering resources and enterprise integration layer 108 for data relating to the building occupant interface in order to provide the building occupant interface to client applications.

Figure 5A:
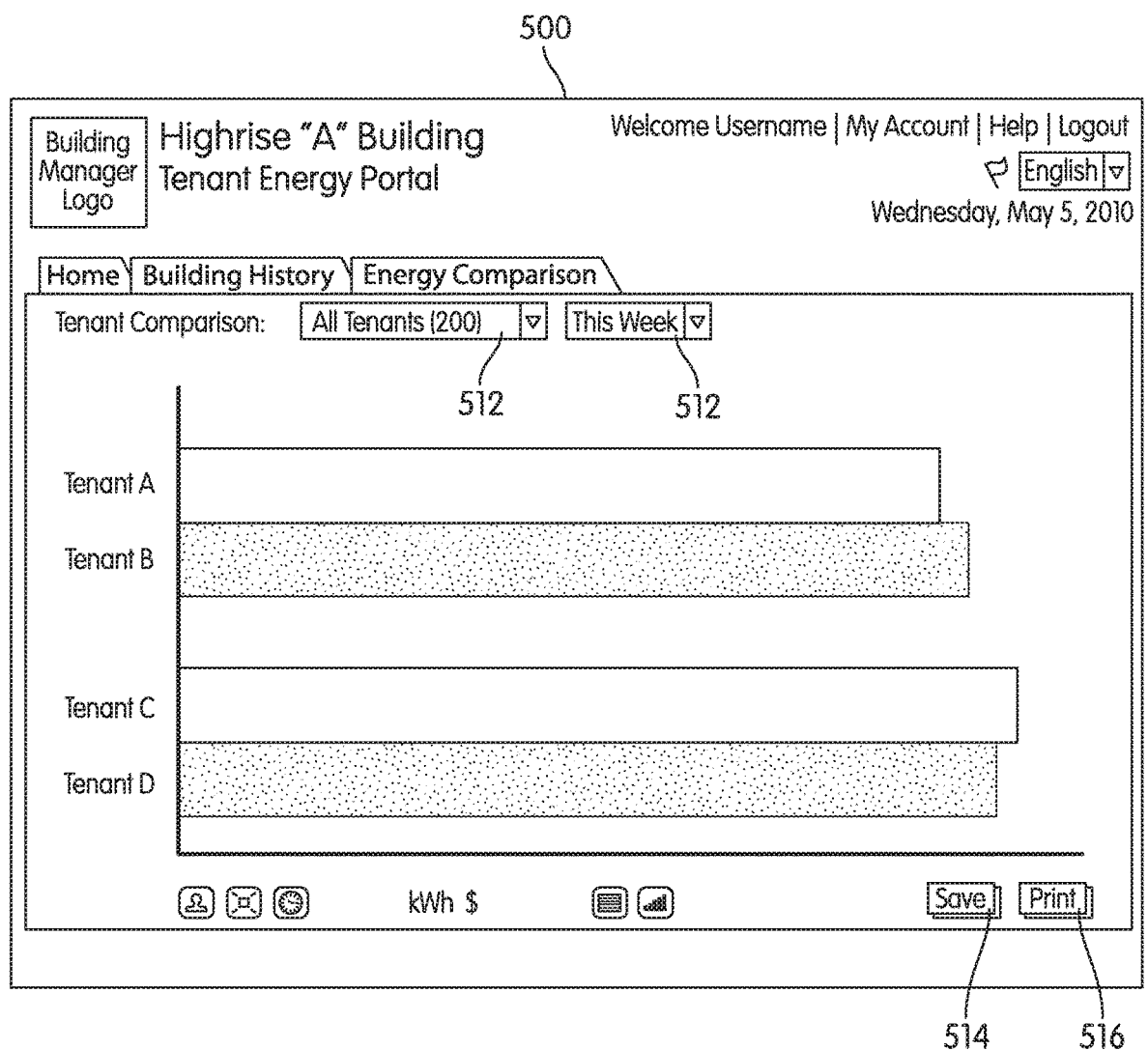
Figure 5B:
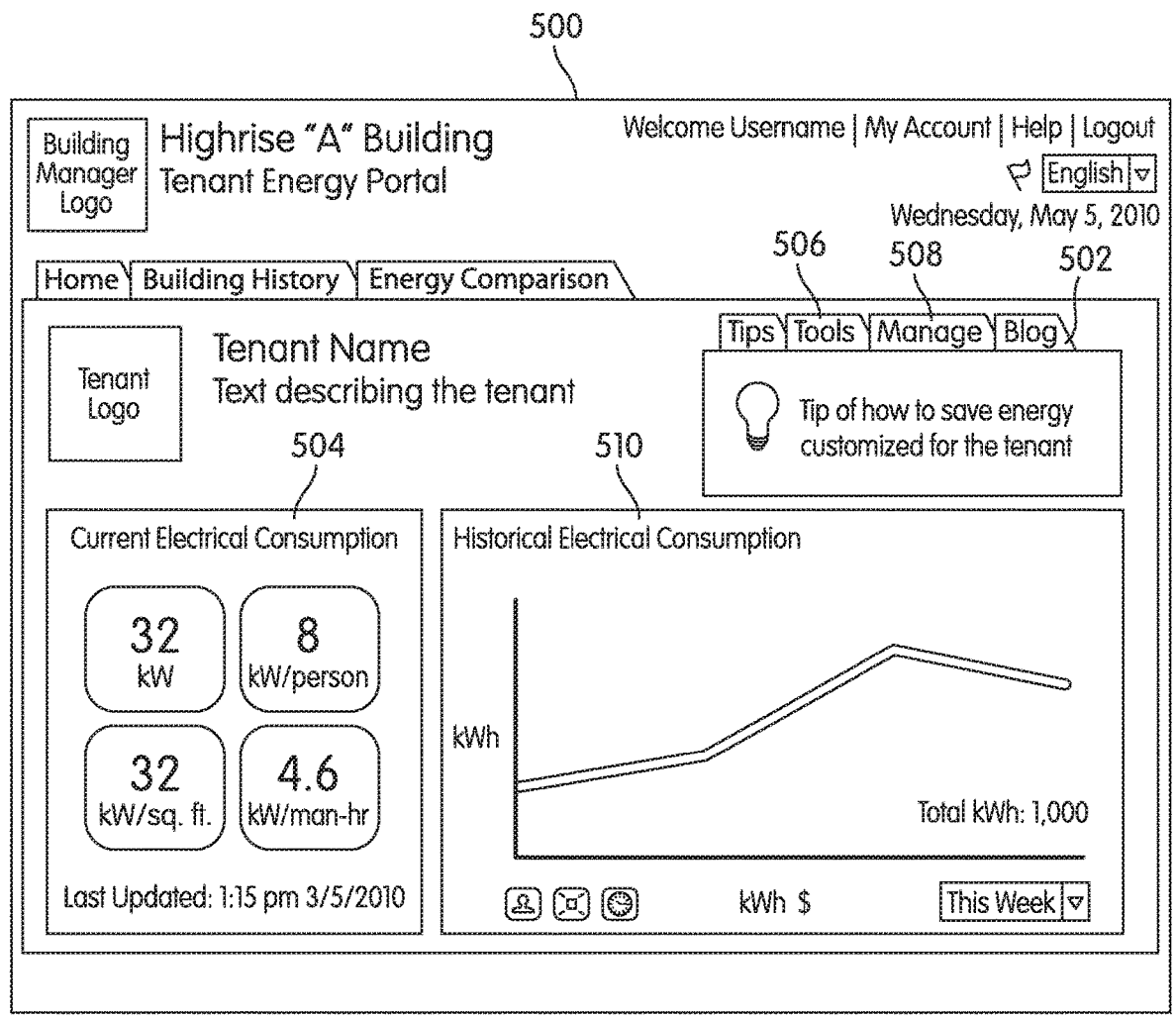
Figure 5C:
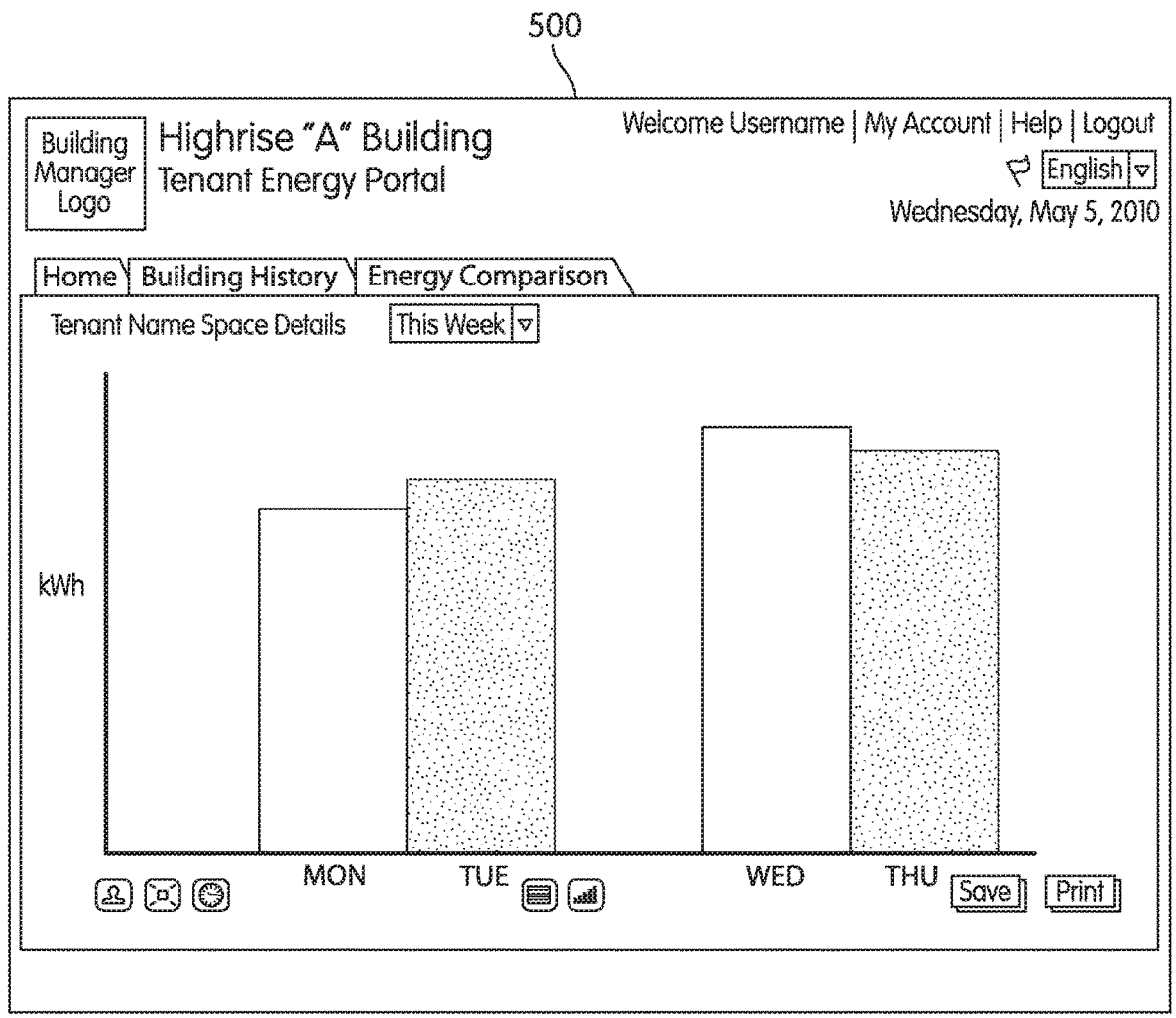

Exemplary graphical user interfaces (GUIs) for the building occupant interface (i.e., tenant energy portal) are shown in FIGS. 5A-5D. In an exemplary embodiment the tenant energy management portal is a web-based user interface that allows a tenant of a participating building to view their energy usage information apart from or in comparison to other tenants in the building. The tenant energy management portal may be configured to utilize services of integrated control layer 116 and/or building subsystem integration layer 318 shown in FIG. 3 to relate particular portions of the building, portions of building subsystems, or particular systems and devices of the building to particular tenants. For example, a relationship stored in ontology database 320 shown in FIG. 3 may include a "serves" relationship. Those devices that serve a particular building space are related (i.e., in a relational database)(e.g., Lighting Controller Y "serves" Floor B). A further relationship may relate each of the building spaces to particular tenants (e.g., Floor B "belongs_to" Tenant A). Accordingly, historical energy usage information relating to particular building spaces or devices can be queried per building tenant and aggregated, averaged, or otherwise computed using services of integrated control layer 116 and/or building subsystem integration layer 318. These aggregations or computations may be reported to a user via GUIs 5A-5D (e.g., graphics constructed by GUI engine 160 and/or web services 158). For example, in some of the GUIs of FIGS. 5A-5D, the tenant energy portal 500 is configured to provide graphs or tabulations of current energy consumption in kilowatts. FIG. 5C is an example of building history data that may be viewed for a portion of a week using the "Building History" tab near the top of the GUI. The tenant energy portal 500 may further be configured to provide associated metrics derived from other data available to, e.g., integrated control 116 or building subsystem integration layer 118. For example, metrics such as kW/ft^2, kW/planned occupants, and kW/counted occupants may be calculated and shown to the user via the GUIs. As illustrated in FIG. 5B, historical consumption for the tenant viewing the portal may be compared to other tenants in the building. Such a view may allow a tenant to identify possible new energy-saving policies (e.g., for automated enforcement via integrated control layer 116 or for human communication— "please remember to turn lights off as you leave your office"). As illustrated in FIG. 5D, building space information such as area, occupants, and man-hours associated with tenants may be shown in addition to energy usage information. The tenant is then able to view consumption relative to other tenants of similar size or use. Other building space metadata may also be shown via the GUIs. For example, tenant type (e.g., law firm, banking, accounting, call center, data center, standard industry code (SIC) types, etc.) and tenant location (e.g., top ⅓ of the building, lower ⅓ of the building) may be shown to the user. Users can use a configuration tool or a menu structure to build custom reports tailored to their individual interests. In other embodiments, logic of the tenant energy portal may be configured to select default views for consumption by a tenant. For example, if the tenant is a law firm, the GUI may, by default, provide the user with a comparison of its energy consumption in comparison to other law firms in the building.

In one exemplary embodiment, tenant energy portal 500 is configured to provide a data sharing mechanism (e.g., a forum, a blog, a "social" networking-type component, etc.). Access to such a mechanism may be obtained by clicking on, for example, "blog" tab 502. Using such a mechanism the tenant can share, comment on, and discuss energy information with other tenants in the building. By allowing tenants to view, manipulate and share their energy data, microeconomic trends may begin to take place—driving down energy usage for the tenants and for the building as a whole. Further, the "social" networking aspect of the data sharing mechanism may encourage participation of and between all tenants in the building. To further encourage such use, the tenant energy management portal may be configured to restrict access to tenant comparisons (or detailed tenant comparisons) unless a tenant is willing to enable sharing of their data. Via a blog or forum feature, tenants can ask questions about their energy usage, bill statements, or energy efficiency measures. The building owner (e.g., a building manager for the owner) may monitor the tenant blogs for common issues or to assist with energy reduction initiatives that the tenant may want to implement. In some embodiments, the tenant energy portal 500 can provide privacy, security, confidentiality, anonymity, or other features for each tenant. Accordingly, each tenant may be provided with security settings.

In an exemplary embodiment access to and supervisory control of the tenant energy portal 500 is controlled by a "building owner" configuration tool. The building owner, using the building owner configuration tool, can define and provide user accounts to his or her tenants. The tenants can then log-in to the system and begin using the tenant energy portal 500. In an exemplary embodiment, after logging into the tenant energy management portal 500, the tenant is shown a personalized main page (FIG. 5B). This main page may include the tenant's real-time energy consumption in a "current electrical consumption" pane 504. As shown in FIG. 5B, current kW/person, kW/sq.ft., and kW/man-hr may also be displayed. The main page may include a tab (e.g., tab 506 or tab 508) that allows the tenant to customize the main page with various modules (e.g., current electrical consumption module 504, historical electrical consumption module 510). Modules 504, 510 may be rearranged on a screen, resized, reconfigured, changed for different modules, or otherwise adjusted by a user. In one example of an alternative module to those shown in FIG. 5B, FIG. 5A illustrates a ranking-style comparison of tenant specific energy consumption relative to all other tenants in the building for the week. The energy comparison of FIG. 5A may be triggered by a user clicking on the "Energy Comparison" tab. Drop down boxes 512 allow a user to change the tenant groupings and time frames for the comparison. In an exemplary embodiment a view created by a user may be saved once updated (e.g., via save button 514) or printed (e.g., via print button 516). Once a view is saved, it can be selected as a module, set as the default view for a tenant, or otherwise recalled or reused. Historical usage details (shown in FIG. 5D) allow the tenant to view its past energy usage. This view supports custom date ranges and can display data in either tabular or graphical format (e.g., a graphical format for historical consumption is shown in module 510). The data can be exported (e.g., to a flat file, to a structured database, saved as a graphic, saved as a screen shot of a tenant view, etc.) so that the tenant may perform custom analysis of their energy data (e.g., using a spreadsheet program). In an exemplary embodiment, the tenant can view the following metrics per defined period: usage in kWh or another unit; utility bill for the period in USD or another unit; cost per square foot (or other units); the average number of occupants during the period; the kWh per occupant during the period; and the kWh per square foot. In an exemplary embodiment, tenant energy portal 500 may be configured to "rank" tenants by energy efficiency and provide each tenant with its rank as well as one or more tips for improving energy efficiency. Such rankings and comparisons are intended to provide a "race" to energy efficiency among building tenants. In large buildings, such races may have very significant impacts on energy efficiency and energy savings.

Communication and Security Features

Referring again to FIG. 3, the smart building manager may be configured to provide drivers for BACnet, LON, N2, Modbus, OPC, OBIX, MIG, SMTP, XML, Web services, and various other wireless communications protocols including Zigbee. These drivers may be implemented within or used by the service bus adapters or subsystem adapters. The service bus for the smart building manager may be configured to communicate using any number of smart grid communications standards. Such standards may be utilized for intra-manager communication as well as communication with a smart grid component (e.g., utility company, smart meter, etc.). For example, the smart building manager may be configured to use the ANSI C12.22/C12.19 protocol for some internal communications (e.g., DR events) as well as for communications with the smart grid. The service bus adapters and subsystem adapters convert received messages into a normalized messaging format for use on the service bus. In an exemplary embodiment the service bus is flexible, making use of IT-centric message queuing technologies (e.g., Open AMQ, MSMQ, and WebSphere MQ) to assure reliability, security, scalability, and performance. Service bus adapters enable layers and applications to communicate among one another and/or to the various in-building or external systems (e.g., via subsystem adapters). Stored communications rules may be used by the service bus adapters, subsystem adapters, or other components of the system to catch or correct communications failures. Communications and action-failure rules may also be configured for use by the action layers of the system. For example, the DR layer can check for whether an action requested or commanded by the DR layer has completed. If not, the DR layer can take a different action or a corrective action (e.g., turn off an alternate load, adjust additional setpoints, trigger a focused FDD activity, etc.) to ensure that DR needs are met. The smart building manager can also determine if someone has provided a DR override command to the system and take corrective action if available. If corrective action is unavailable, an appropriate message or warning may be sent to a DR partner (e.g., a utility co., an energy purchaser via the smart grid, etc.).

The smart building manager 106 may reside on (e.g., be connected to) an IP Ethernet network utilizing standard network infrastructure protocols and applications (e.g., DNS, DHCP, SNTP, SNMP, Active Directory, etc.) and can also be secured using IT security best practices for those standard network infrastructure protocols and applications. For example, in some embodiments the smart building manager may include or be installed "behind" infrastructure software or hardware such as firewalls or switches. Further, configurations in the smart building manager 106 can be used by the system to adjust the level of security of the smart building manager 106. For example, the smart building manager 106 (or particular components thereof) can be configured to allow its middle layers or other components to communicate only with each other, to communicate with a LAN, WAN, or Internet, to communicate with select devices having a building service, or to restrict communications with any of the above mentioned layers, components, data sources, networks, or devices. The smart building manager 106 may be configured to support a tiered network architecture approach to communications which may provide for some measure of security. Outward facing components are placed in a less secure "tier" of the network to act as a point of entry to/from the smart building manager 106. These outward facing components are minimized (e.g., a web server receives and handles all requests from client applications) which limits the number of ways the system can be accessed and provides an indirect communications route between external devices, applications, and networks and the internal layers or modules of the smart building manager 106. For example, "behind" the outward facing "first tier" may lie a more secure tier of the network that requires for authentication and authorization to occur at the first tier before functions of the more secure tier are accessed. The smart building manager 106 may be configured to include firewalls between such tiers or to define such tiers to protect databases or core components of the system from direct unauthorized access from outside networks.

In addition to including or implementing "infrastructure" type security measures as the type disclosed above, the smart building manager may be configured to include a communications security module configured to provide network message security between the smart building manager and an outside device or application. For example, if SOAP messaging over HTTP is used for communication at the enterprise integration layer, the SOAP messages may be concatenated to include an RC2 encrypted header containing authentication credentials. The authentication credentials may be checked by the receiving device (e.g., the smart building manager, the end application or device, etc.). In some embodiments the encrypted header may also contain information (e.g., bits) configured to identify whether the message was tampered with during transmission, has been spoofed, or is being "replayed" by an attacker. If a message does not conform to an expected format, or if any part of the authentication fails, the smart building manager may be configured to reject the message and any other unauthorized commands to the system. In some embodiments that use HTTP messages between the application and the smart building manager, the smart building manager may be configured to provide SSL for message content security (encryption) and/or Forms authentication for message authentication.

The smart building manager 106 may yet further include an access security module that requires any application to be authenticated with user credentials prior to logging into the system. The access security module may be configured to complete a secure authentication challenge, accomplished via a public or private key exchange (e.g., RSA keys) of a session key (e.g., an RC2 key), after a login with user credentials. The session key is used to encrypt the user credentials for the authentication challenge. After the authentication challenge, the session key is used to encrypt the security header of the messages. Once authenticated, user actions within the system are restricted by action-based authorizations and can be limited. For example, a user may be able to command and control HVAC points, but may not be able to command and control Fire and Security points. Furthermore, actions of a user within the smart building manager are written to memory via an audit trail engine, providing a record of the actions that were taken. The database component of the smart building manager 106 (e.g., for storing device information, DR profiles, configuration data, pricing information, or other data mentioned herein or otherwise) can be accessible via an SQL server that is a part of the building management server or located remotely from the smart building manager 106. For example, the database server component of the smart building manager 106 may be physically separated from other smart building manager components and located in a more secure tier of the network (e.g., behind another firewall). The smart building manager 106 may use SQL authentication for secure access to one or more of the aforementioned databases. Furthermore, in an exemplary embodiment the smart building manager can be configured to support the use of non-default instances of SQL and a non-default TCP port for SQL. The operating system of the smart building manager may be a Windows-based operating system.

Each smart building manager 106 may provide its own security and is not reliant on a central server to provide the security. Further, the same robustness of the smart building manager 106 that provides the ability to incorporate new building subsystem communications standards, modules, drivers and the like also allows it to incorporate new and changing security standards (e.g., for each module, at a higher level, etc.).

Multi-Campus/Multi-Building Energy Management

The smart building manager 106 shown in the Figures may be configured to support multi-campus or multi-building energy management services. Each of a plurality of campuses can include a smart building manager configured to manage the building, IT, and energy resources of each campus. In such an example, the building subsystems shown, e.g., in FIGS. 1A and 1B may be a collection of building subsystems for multiple buildings in a campus. The smart building manager may be configured to bi-directionally communicate with on-site power generation systems (e.g., distributed power sources, related services, solar arrays, fuel cell arrays, diesel generators, combined heat and power (CHP) systems, etc.), plug-in hybrid electric vehicle (PHEV) systems, and energy storage systems (e.g., stationary energy storage, thermal energy storage, etc.). Data inputs from such sources may be used by the demand and response layer of the smart building manager to make demand or response decisions and to provide other ancillary services to a connected smart grid (e.g., utility, smart meter connected to a utility, etc.) in real time or near real time. For example, the smart building manager may communicate with smart meters associated with an energy utility and directly or indirectly with independent systems operators (ISOs) which may be regional power providers. Using these communications, and its inputs from devices of the campus, the smart building manager (e.g., the demand response layer) is configured to engage in "peak shaving," "load shedding," or "load balancing" programs which provide financial incentives for reducing power draw during certain days or times of day. The demand response layer or other control algorithms of the smart building manager (e.g., control algorithms of the integrated control layer) may be configured to use weather forecast information to make setpoint or load shedding decisions (e.g., so that comfort of buildings in the campus is not compromised). The smart building manager may be configured to use energy pricing information, campus energy use information, or other information to optimize business transactions (e.g., the purchase of energy from the smart grid, the sale of energy to the smart grid, the purchase or sale of carbon credits with energy providers and purchasers, etc.). The smart building manager is configured to use the decisions and processing of the demand response layer to affect control algorithms of the integrated control layer.

While FIG. 1B is shown as a tightly-coupled smart building manager 106, in some embodiments the processing circuit of FIG. 1B (including the layers/modules thereof) may be distributed to different servers that together form the smart building manager having the control features described herein. In embodiments where the smart building manager 106 is controlling an entire campus or set of campuses, one or more smart building managers may be layered to effect hierarchical control activities. For example, an enterprise level smart building manager may provide overall DR strategy decisions to a plurality of lower level smart building managers that process the strategy decisions (e.g., using the framework shown in FIG. 3) to effect change at an individual campus or building. By way of further example, the "integrated control layer" 116 and the "building system integration layer" 118 may be replicated for each building and stored within lower level smart building servers while a single enterprise level smart building manager may provide a single higher level layer such the DR layer. Such a DR layer can execute a campus-wide DR strategy by passing appropriate DR events to the separate lower level smart building mangers having integrated control layers and building system integration layers. Higher level servers may provide software interfaces (APIs) to the one or more lower level servers so that the one or more lower level servers can request information from the higher level server, provide commands to the higher level server, or otherwise communicate with the layers or data of the higher level server. The reverse is also true, APIs or other software interfaces of the lower level servers may be exposed for consumption by the higher level server. The software interfaces may be web services interfaces, relational database connections, or otherwise.

CONFIGURATIONS OF VARIOUS EXEMPLARY EMBODIMENTS

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on memory or other machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products or memory comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures may show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

The invention claimed is:

1. A building manager comprising:
   a communications interface configured to receive time-of-use pricing information from a smart energy grid; and
   a processing circuit comprising a processor and non-transitory computer-readable medium with instructions executable by the processor stored thereon, the non-transitory computer-readable medium comprising:
   an integrated control layer configured to receive inputs from at least one building subsystem and to provide an output to the at least one building subsystem, the integrated control layer including at least one control algorithm module configured to process the inputs and to determine outputs;
   a demand response layer configured to process the time-of-use pricing information received from the smart energy grid to automatically determine which of a plurality of energy storage devices to operate and determine adjusted setpoints for one or more of the energy storage devices, the adjusted setpoints comprising setpoint energy transfer rates into one or more of the energy storage devices and out of one or more of the energy storage devices;
   wherein the at least one control algorithm module of the integrated control layer is configured to use the setpoint energy transfer rates to generate control signals for the at least one building subsystem and provide the control signals as the outputs to the at least one building subsystem.

2. The building manager of claim 1, further comprising:
   an enterprise applications layer configured to provide a building occupant interface to at least one building occupant.

3. The building manager of claim 1, comprising:
   an automated measurement and validation layer configured to measure energy use or track energy savings based on representations of the inputs stored in memory according to an international performance management and verification protocol (IPMVP).

4. The building manager of claim 3, further comprising:
   an enterprise applications layer configured to provide services to enterprise level applications for communicating with the integrated control layer, the demand response layer, and the automated measurement and validation layer.

5. The building manager of claim 3, wherein the automated measurement and validation layer is configured to monitor energy consumption for a building based on the inputs from the building subsystem.

6. The building manager of claim 5, wherein the automated measurement and validation layer completes a calculation of energy consumption for the building without using inputs from a utility meter or power provider.

7. The building manager of claim 6, wherein the automated measurement and validation layer is configured to validate energy use information provided by a utility or meter using the calculation of energy consumption for the building that is calculated without using the inputs from the utility meter or power provider.

8. The building manager of claim 3, wherein the automated measurement and validation layer is included within a server that includes both the integrated control layer and the demand response layer.

9. The building manager of claim 1, wherein the demand response layer is configured to monitor and control a power switching device to rout power to one or more destinations from the one or more of the energy storage devices.

10. The building manager of claim 9, wherein the demand response layer is configured to controllably shift energy loads from peak to off peak times using the energy storage devices.

11. The building manager of claim 10, wherein the demand response layer is configured to shed energy loads associated with the at least one building subsystem using one or more of the energy storage devices based on a signal received during peak times.

12. The building manager of claim 11, wherein the signal is one of a high price signal and a contracted curtailment signal.

13. The building manager of claim 1, wherein the energy storage devices include at least one of a battery, a thermal energy storage tank and one or more plug-in hybrid electric vehicles.

14. The building manager of claim 1, wherein the integrated control layer is configured to use inputs from the smart energy grid, building energy loads, and/or building energy storage in a control algorithm configured to reduce energy costs based on the inputs.

15. The building manager of claim 14, wherein the demand response layer is configured to adjust or affect the control algorithm of the integrated control layer by planning a control strategy based on received real time pricing (RTP) information or forecasted pricing information for energy from a utility.

16. The building manager of claim 15, wherein the demand response layer is further configured to calculate an estimate of demand loads for the building for upcoming time periods based on at least one of historical information, forecasted pricing, scheduled facility control events, and the inputs from the building subsystem.

17. The building manager of claim 16, wherein the demand response layer is further configured to provide the calculated estimate of demand loads for the building to the smart energy grid for an energy provider.

18. The building manager of claim 14, wherein the demand response layer is configured to automatically adjust or affect the control algorithm of the integrated control layer using model predictive control.

19. A building manager comprising:
a communications interface configured to receive time-of-use pricing information from a smart energy grid; and
a processing circuit comprising a processor and non-transitory computer-readable medium with instructions executable by the processor stored thereon, the non-transitory computer-readable medium comprising:
an integrated control layer configured to receive inputs from at least one building subsystem and to provide outputs to the at least one building subsystem, the integrated control layer including at least one control algorithm module configured to process the inputs and to determine the outputs; and
a demand response layer configured to process the time-of-use pricing information received from the smart energy grid to automatically determine which of a plurality of energy storage devices to operate and determine adjusted setpoints for one or more of the energy storage devices, the adjusted setpoints comprising setpoint energy transfer rates into the one or more energy storage devices and out of one or more of the energy storage devices, the demand response layer further configured to automatically adjust or affect one or more of the at least one control algorithm module using model predictive control;
wherein the at least one control algorithm module of the integrated control layer is configured to use the setpoint energy transfer rates to generate control signals for the at least one building subsystem and provide the control signals as the outputs to the at least one building subsystem.

20. A building manager comprising:
a communications interface configured to receive time-of-use pricing information from a smart energy grid; and
a processing circuit comprising a processor and non-transitory computer-readable medium with instructions executable by the processor stored thereon, the non-transitory computer-readable medium comprising:
an integrated control layer configured to receive inputs from at least one building subsystem and to provide outputs to the at least one building subsystem, the integrated control layer including at least one control algorithm module configured to process the inputs and to determine the outputs; and
a demand response layer configured to process the time-of-use pricing information received from the smart energy grid automatically determine which of a plurality of energy storage devices to operate and to determine adjusted setpoints for one or more of the energy storage devices, the adjusted setpoints comprising setpoint energy transfer rates into one or more of the energy storage devices and out of one or more of the energy storage devices, the demand response layer further configured to controllably shift energy loads from peak to off peak times using the energy storage devices;
wherein the at least one control algorithm module of the integrated control layer is configured to use the adjusted setpoints to generate control signals for the at least one building subsystem and provide the control signals as the outputs to the at least one building subsystem.

* * * * *